United States Patent
Le et al.

(10) Patent No.: US 10,727,138 B2
(45) Date of Patent: Jul. 28, 2020

(54) INTEGRATION OF SINGLE CRYSTALLINE TRANSISTORS IN BACK END OF LINE (BEOL)

(71) Applicant: Intel Corporation, Santa Clara, CA (US)

(72) Inventors: Van H. Le, Beaverton, OR (US); Marko Radosavljevic, Beaverton, OR (US); Benjamin Chu-Kung, Portland, OR (US); Rafael Rios, Austin, TX (US); Gilbert Dewey, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 16/094,452

(22) PCT Filed: Jun. 28, 2016

(86) PCT No.: PCT/US2016/039814
§ 371 (c)(1),
(2) Date: Oct. 17, 2018

(87) PCT Pub. No.: WO2018/004537
PCT Pub. Date: Jan. 4, 2018

(65) Prior Publication Data
US 2019/0131187 A1    May 2, 2019

(51) Int. Cl.
*H01L 21/84* (2006.01)
*H01L 29/423* (2006.01)
(Continued)

(52) U.S. Cl.
CPC ........... *H01L 21/84* (2013.01); *B82Y 10/00* (2013.01); *H01L 21/76838* (2013.01); *H01L 21/8221* (2013.01); *H01L 21/823431* (2013.01); *H01L 21/823821* (2013.01); *H01L 23/5226* (2013.01); *H01L 24/00* (2013.01); *H01L 27/0688* (2013.01); *H01L 27/1207* (2013.01); *H01L 27/1211* (2013.01); *H01L 29/0673* (2013.01); *H01L 29/0847* (2013.01);
(Continued)

(58) Field of Classification Search
CPC combination set(s) only.
See application file for complete search history.

(56) References Cited

U.S. PATENT DOCUMENTS

| 6,790,699 B2 | 9/2004 | Vossenberg et al. |
| 2010/0148171 A1* | 6/2010 | Hayashi ............ H01L 27/1225 257/43 |

(Continued)

OTHER PUBLICATIONS

International Preliminary Report on Patentability for International Patent Application No. PCT/US2016/039814, dated Jan. 10, 2019, 7 pages.

(Continued)

*Primary Examiner* — Ratisha Mehta
(74) *Attorney, Agent, or Firm* — Schwabe, Williamson & Wyatt, P.C.

(57) ABSTRACT

A monocrystalline semiconductor layer is formed on a conductive layer on an insulating layer on a substrate. The conductive layer is a part of an interconnect layer. The monocrystalline semiconductor layer extends laterally on the insulating layer. Other embodiments may be described and/or claimed.

22 Claims, 12 Drawing Sheets

(51) Int. Cl.
| | |
|---|---|
| H01L 29/417 | (2006.01) |
| H01L 21/822 | (2006.01) |
| H01L 29/41 | (2006.01) |
| H01L 29/775 | (2006.01) |
| B82Y 10/00 | (2011.01) |
| H01L 29/66 | (2006.01) |
| H01L 21/8238 | (2006.01) |
| H01L 29/06 | (2006.01) |
| H01L 21/8234 | (2006.01) |
| H01L 29/786 | (2006.01) |
| H01L 29/08 | (2006.01) |
| H01L 27/06 | (2006.01) |
| H01L 23/00 | (2006.01) |
| H01L 21/768 | (2006.01) |
| H01L 23/522 | (2006.01) |
| H01L 27/12 | (2006.01) |
| H01L 27/092 | (2006.01) |
| H01L 21/02 | (2006.01) |
| H01L 23/532 | (2006.01) |

(52) U.S. Cl.
CPC ...... *H01L 29/413* (2013.01); *H01L 29/41725* (2013.01); *H01L 29/42376* (2013.01); *H01L 29/66439* (2013.01); *H01L 29/66772* (2013.01); *H01L 29/775* (2013.01); *H01L 29/78654* (2013.01); *H01L 21/0262* (2013.01); *H01L 21/02532* (2013.01); *H01L 21/02598* (2013.01); *H01L 21/02645* (2013.01); *H01L 23/53209* (2013.01); *H01L 27/092* (2013.01); *H01L 29/0676* (2013.01); *H01L 2224/16225* (2013.01)

(56) References Cited

U.S. PATENT DOCUMENTS

| | | |
|---|---|---|
| 2012/0326309 A1 | 12/2012 | Andry |
| 2013/0051150 A1 | 2/2013 | Roizin et al. |
| 2015/0162448 A1* | 6/2015 | Raghavan ............ H01L 29/7869 257/43 |
| 2015/0162913 A1* | 6/2015 | Genoe ................ H03K 19/1776 326/41 |
| 2016/0093695 A1 | 3/2016 | Cheng et al. |

OTHER PUBLICATIONS

International Search Report and Written Opinion for International Patent Application No. PCT/US2016/039814 dated Mar. 28, 2017, 10 pgs.

* cited by examiner

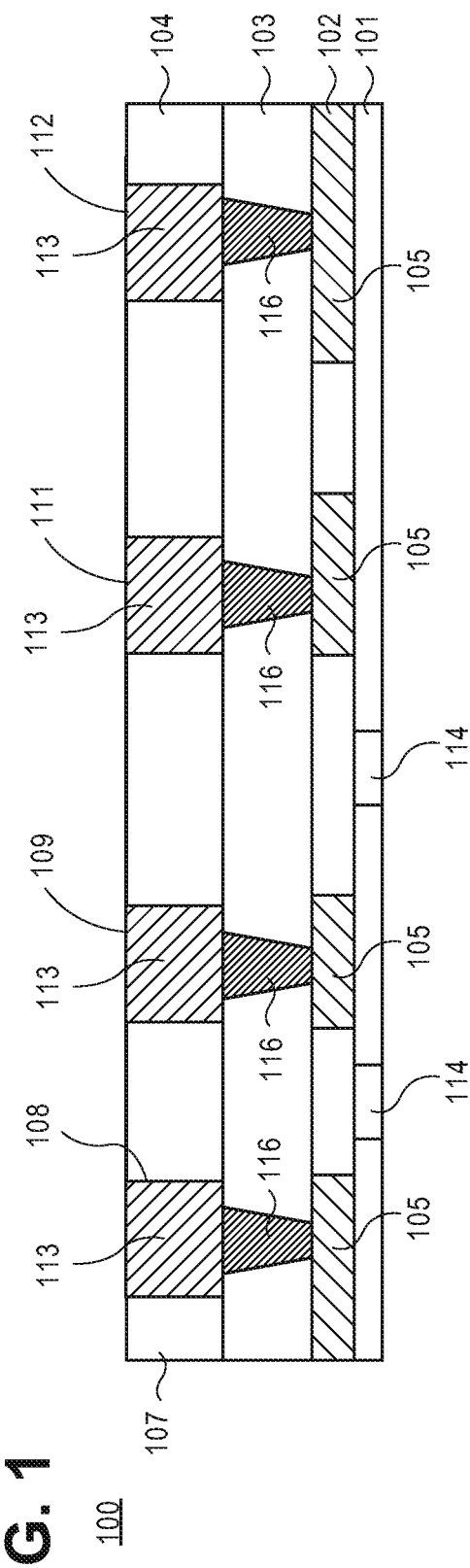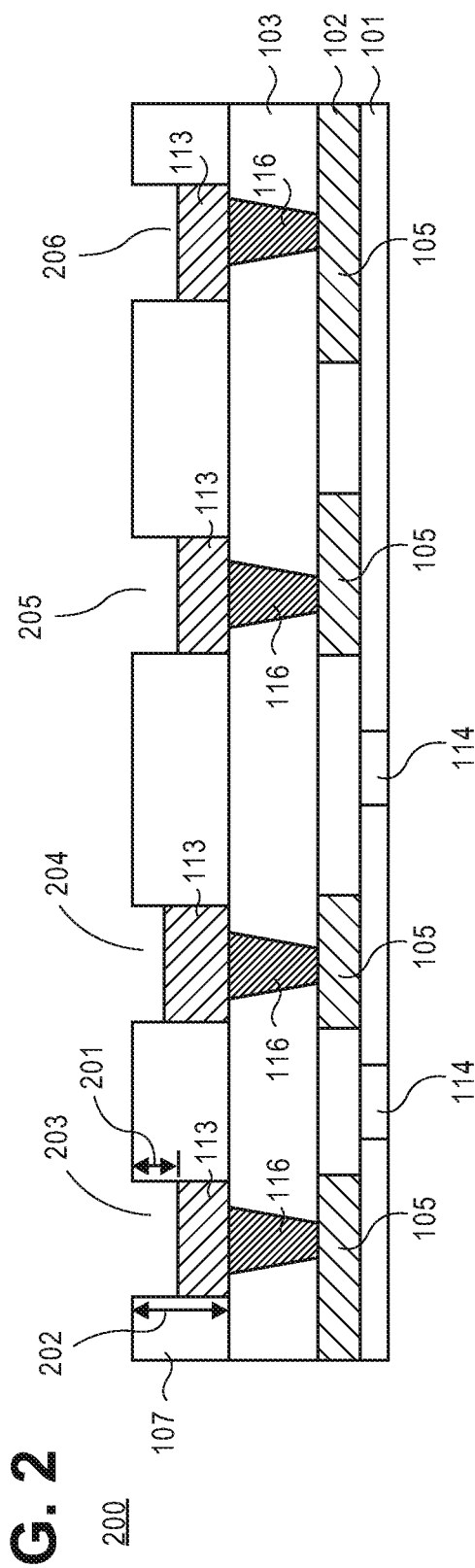

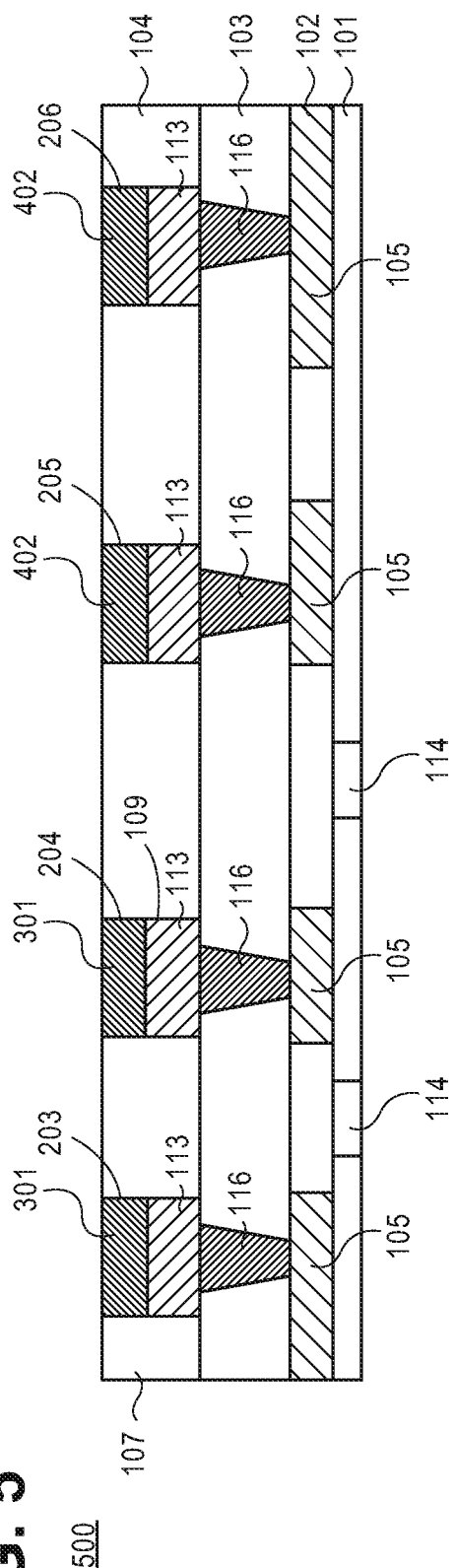

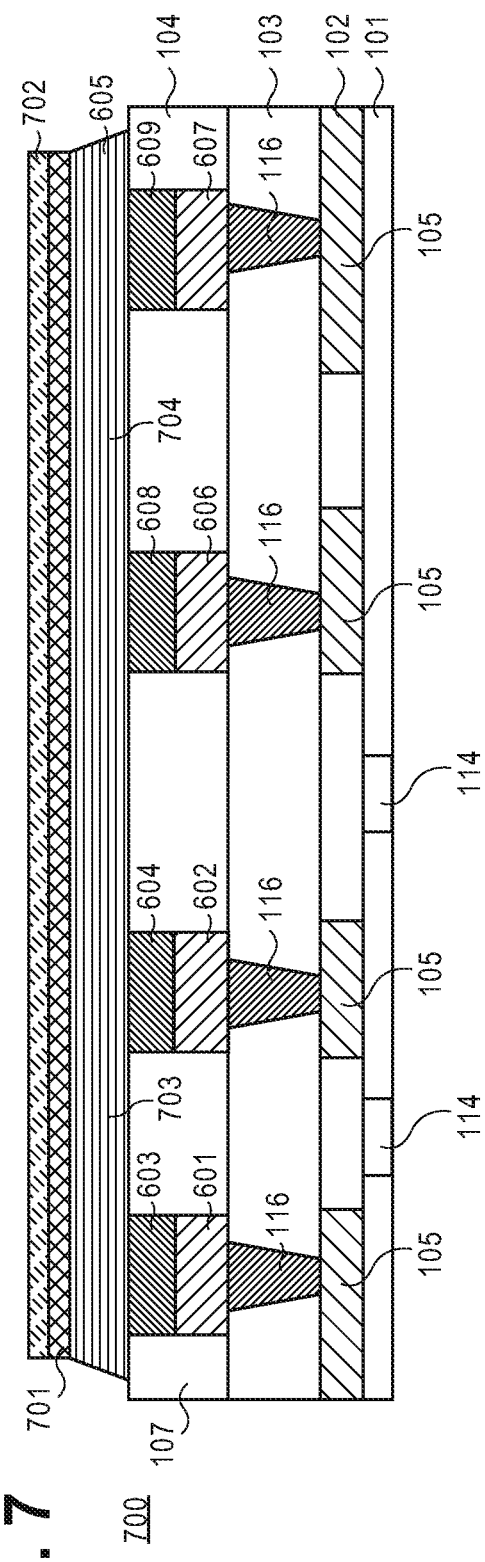
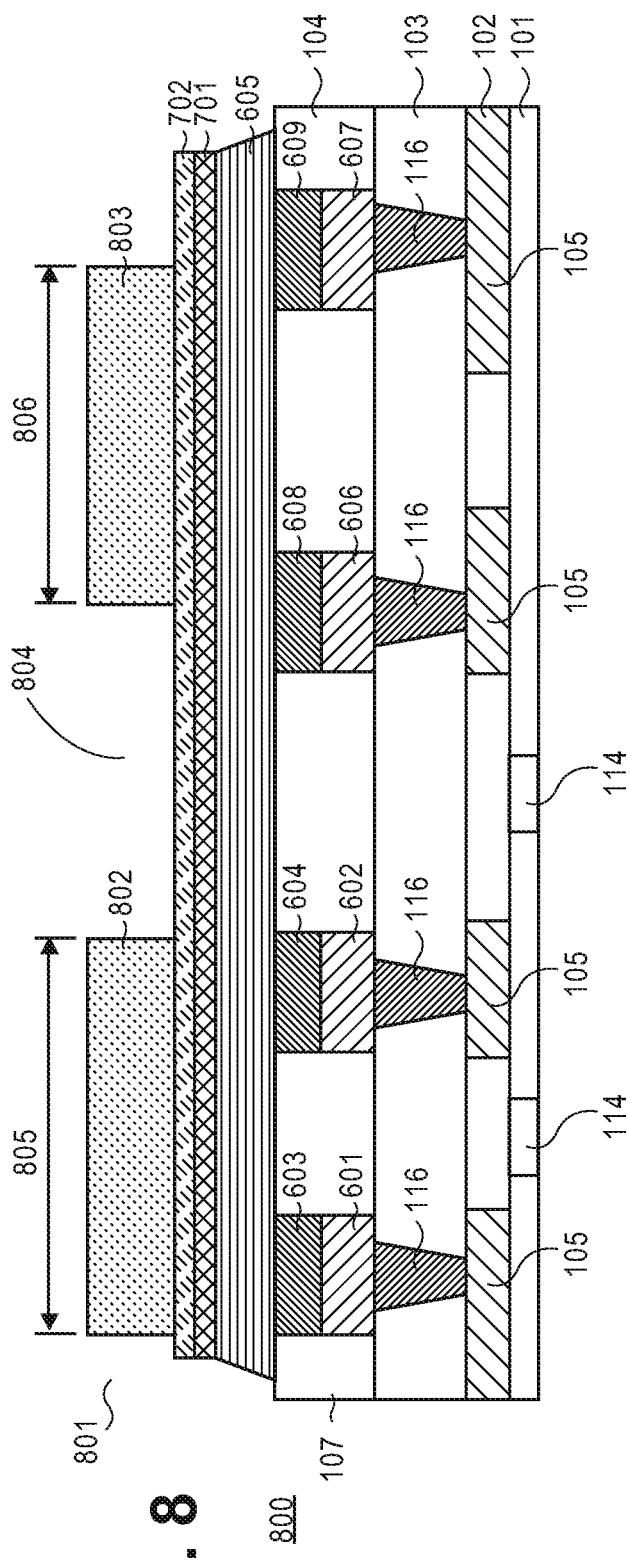

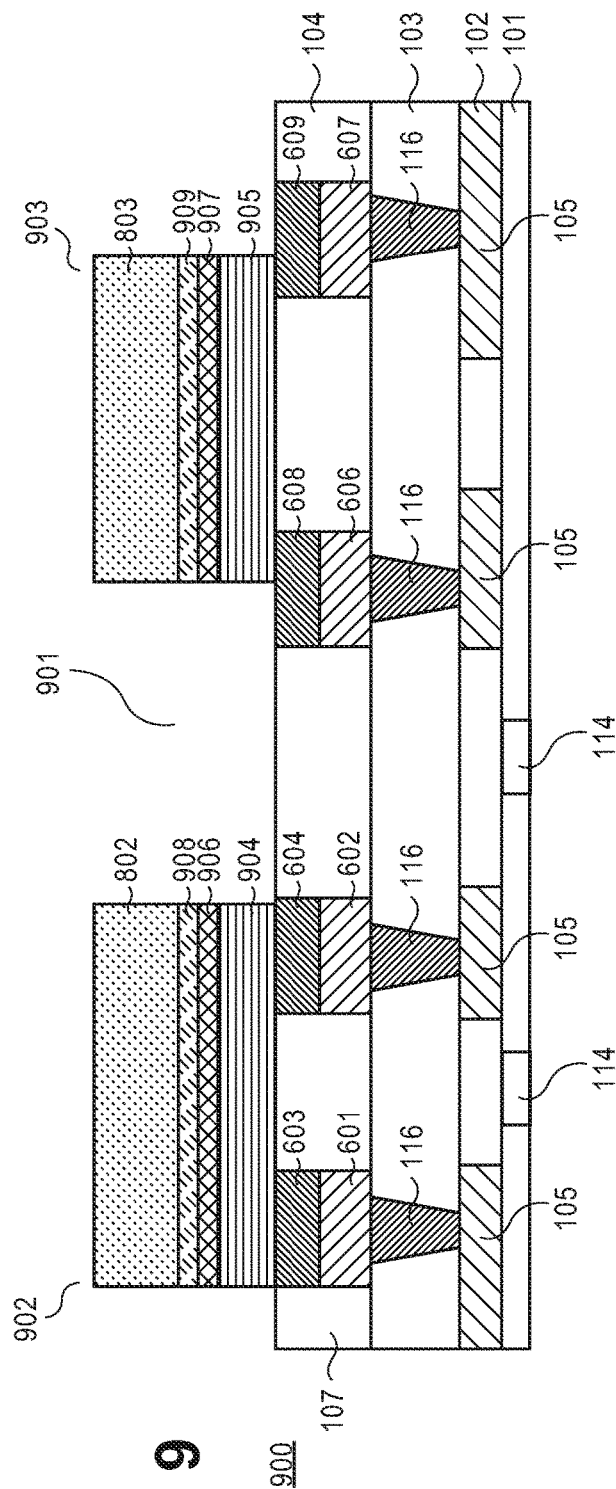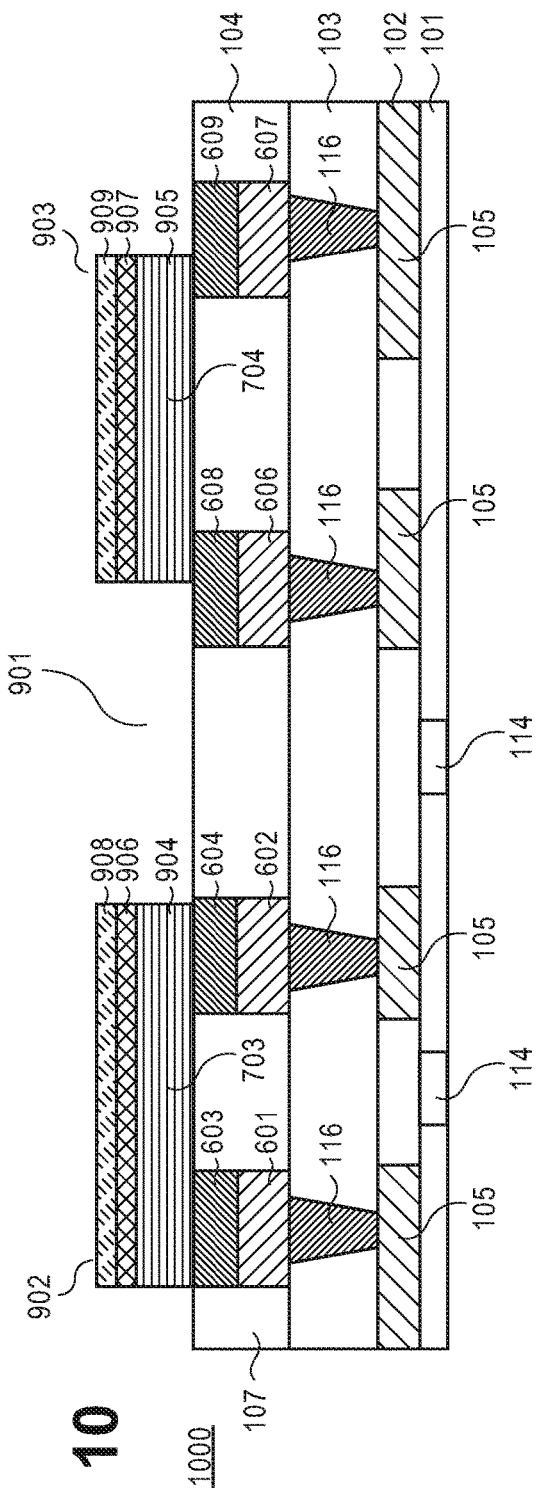

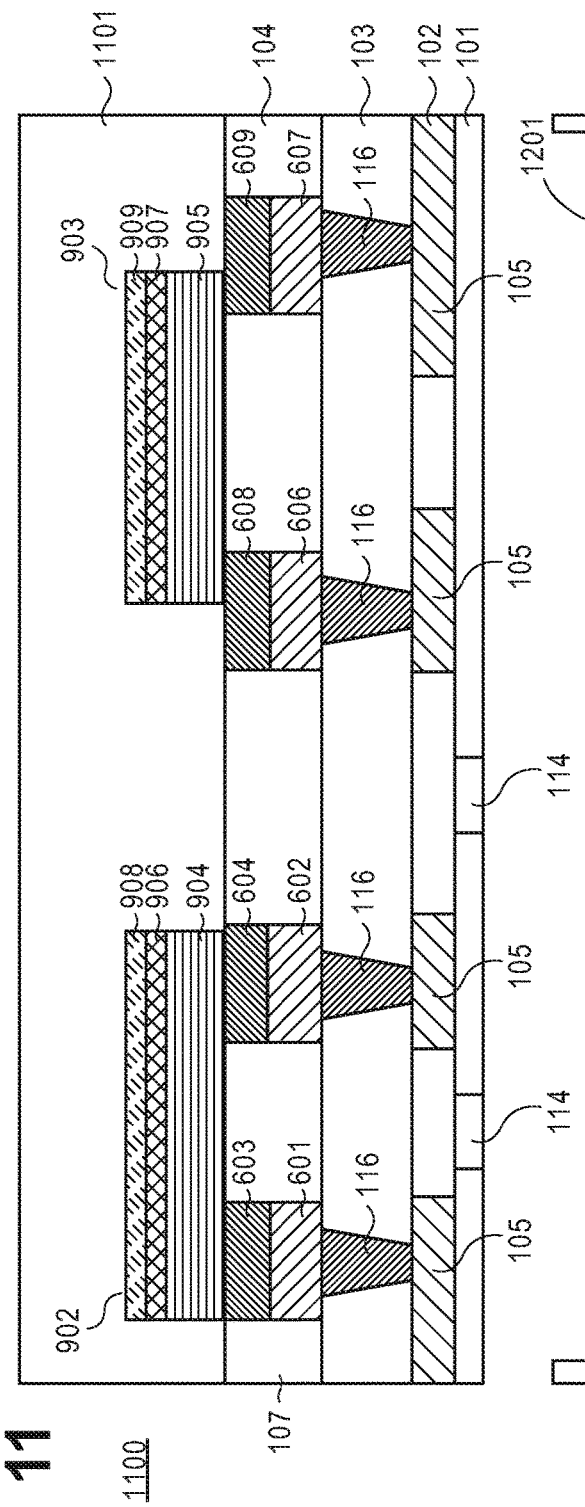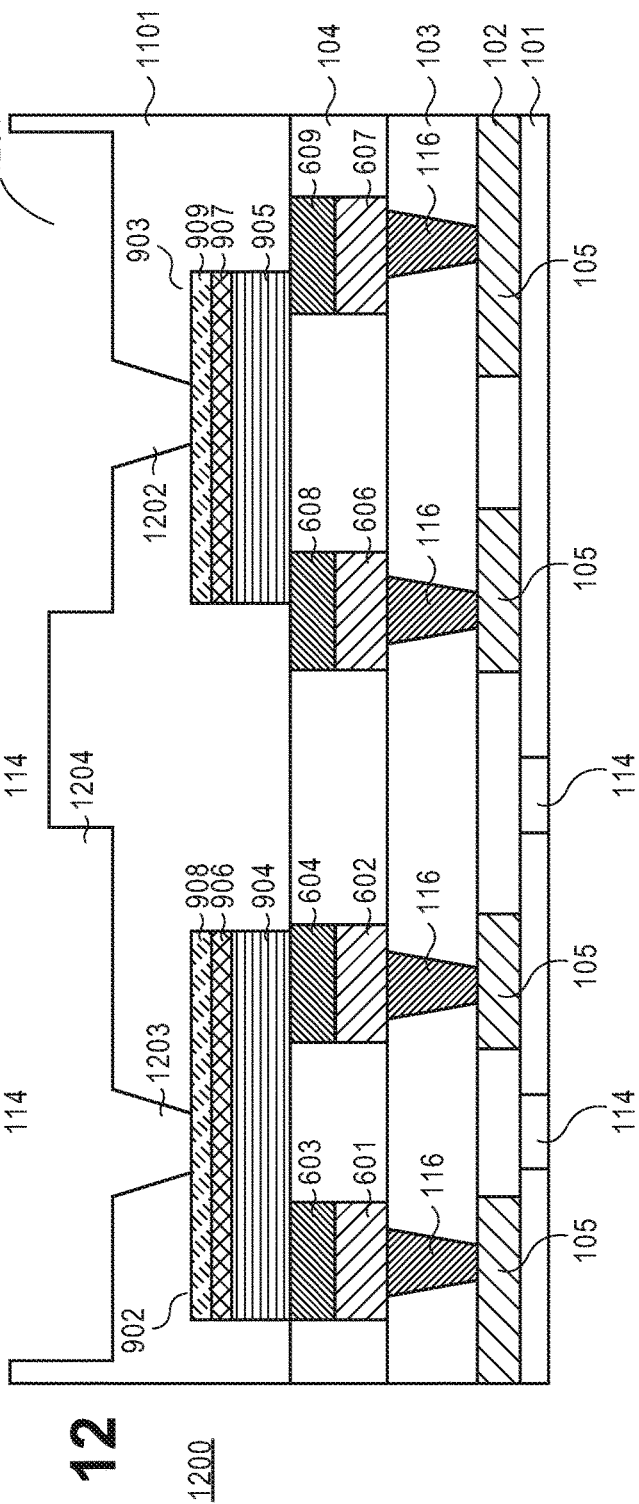

INTEGRATION OF SINGLE CRYSTALLINE TRANSISTORS IN BACK END OF LINE (BEOL)

CROSS-REFERENCE TO RELATED APPLICATION

This patent application is a U.S. National Phase Application under 35 U.S.C. § 371 of International Application No. PCT/US2016/039814, filed Jun. 28, 2016, entitled "INTEGRATION OF SINGLE CRYSTALLINE TRANSISTORS IN BACK END OF LINE (BEOL)," which designates the United States of America, the entire disclosure of which is hereby incorporated by reference in its entirety and for all purposes.

FIELD

Embodiments as described herein relate to a field of electronic device manufacturing, and in particular, to an integrated circuit (IC) manufacturing.

BACKGROUND

Decreasing the dimensions of semiconductor devices and increasing the level of their integration are two of the major trends in the current semiconductor device manufacturing. As a result of these trends, the density of elements forming a semiconductor device continuously increases.

Generally, an integrated circuit includes one or more levels of metal lines to connect the electronic devices of the IC to one another and to external connections. An interlayer dielectric is placed between the metal levels of the IC for insulation.

Typically, an IC fabrication process includes a front end of line (FEOL) portion and a back end of line (BEOL) portion. The FEOL portion refers to a first stage of the IC fabrication where the individual devices (e.g., transistors, capacitors, resistors) are patterned in the semiconductor wafer. The BEOL refers to a second stage of the IC fabrication where the individual devices are interconnected with a wiring on the wafer. Generally, BEOL involves forming contacts (e.g., pads), interconnect wires (e.g., one or more levels of metal lines), vias, insulating layers (dielectrics), and bonding sites for chip-to-package connections.

To increase the level of the device integration, three dimensional integrated circuits (3D ICs) are created by interconnecting wafers, dies, or both vertically using through silicon vias (TSVs) to achieve performance improvements at reduced power and smaller footprint than conventional two dimensional processes. Typically, the traditional 3D IC fabrication techniques complicate the integration process and are costly.

BRIEF DESCRIPTION OF THE DRAWINGS

Embodiments of the invention may be best understood by referring to the following description and accompanying drawings that are used to illustrate embodiments of the invention. In the drawings:

FIG. 1 shows a view illustrating a portion of an electronic device structure according to one embodiment.

FIG. 2 is a view similar to FIG. 1 after the conductive layer is recessed according to one embodiment.

FIG. 5 is a view similar to FIG. 4 after the protection layer is removed and portions of the monocrystalline layers are removed according to one embodiment.

FIG. 6 is a view similar to FIG. 5 after a monocrystalline semiconductor layer is deposited on the planarized monocrystalline layers according to one embodiment.

FIG. 7 is a view similar to FIG. 6 after a gate electrode layer is deposited on a gate dielectric layer on the monocrystalline semiconductor layer according to one embodiment.

FIG. 8 is a view similar to FIG. 7 after depositing a patterned mask layer on the gate electrode layer according to one embodiment.

FIG. 9 is a view similar to FIG. 8 after portions of the gate electrode layer on the gate dielectric layer on the monocrystalline semiconductor layer on the insulating layer are etched to form a space to separate transistor devices according to one embodiment.

FIG. 10 is a view similar to FIG. 9 after the patterned mask layer is removed according to one embodiment.

FIG. 11 is a view similar to FIG. 10 after an insulating layer is deposited to fill the space between the transistor devices according to one embodiment.

FIG. 12 is a view similar to FIG. 11 after openings are formed in the insulating layer to provide a contact to a gate electrode according to one embodiment.

DETAILED DESCRIPTION

Figure 3:
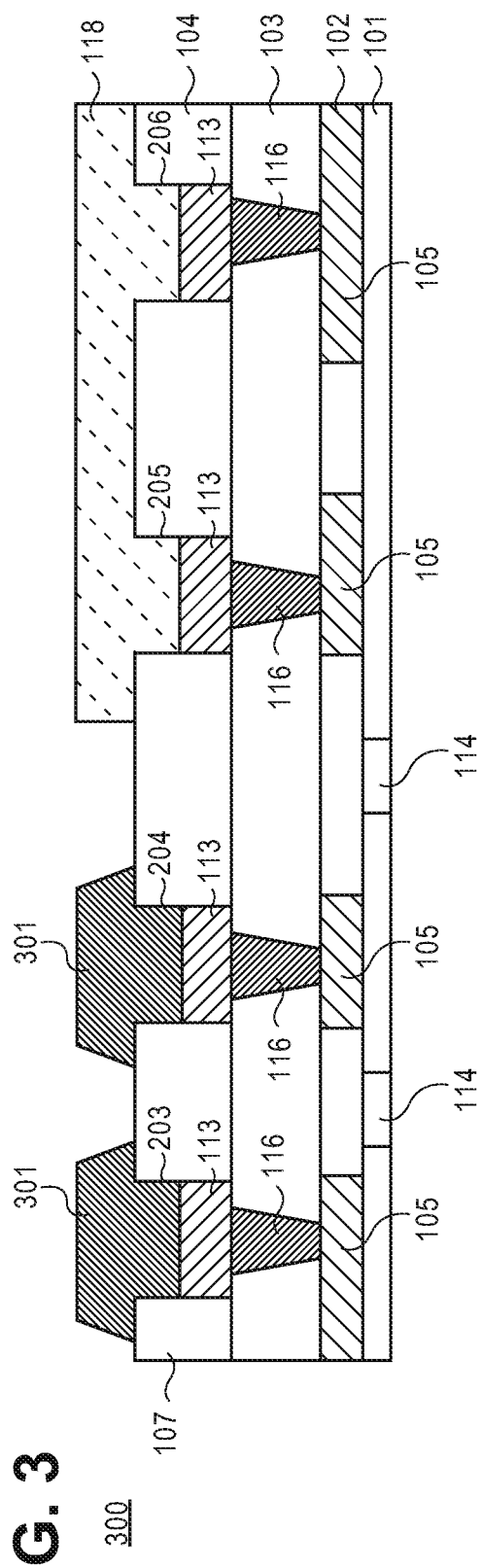
FIG. 3 is a view similar to FIG. 2 after a protection layer is deposited on a portion of the interconnect layer and a monocrystalline semiconductor layer is deposited on the conductive layer according to one embodiment.

Methods and apparatuses to provide monolithic integration of single crystalline transistors in a back end of line (BEOL) process are described. A monocrystalline semiconductor layer is formed on a conductive layer in an opening in an insulating layer on a substrate. The conductive layer is a part of an interconnect layer. The monocrystalline semiconductor layer extends laterally on the insulating layer.

In at least some embodiments, a technique for a monolithic integration of a single crystalline germanium (Ge) complementary metal oxide semiconductor (CMOS) in the BEOL is used to increase device performance, increase device density, reduce power consumption and reduce device footprint comparing with conventional techniques. In at least some embodiments, the monolithic integration of the single crystalline germanium (Ge) complementary metal oxide semiconductor (CMOS) in the BEOL process provides better quality transistor channel with less defects and subsequently higher performance over the conventional techniques.

In at least some embodiments, metal features in the BEOL layers are used for a metal assisted single crystal epitaxy growth. The single crystalline (monocrystalline) semiconductor seeds off the metal feature to form single crystals that then grow out of the metal via trench and laterally over an insulating layer to deposit the monocrystalline channel layer on top of the insulating layer. The monocrystalline channel layer is patterned to create monocrystalline metal oxide semiconductor field effect transistors (MOSFETs) in the BEOL with increased device performances compared to conventional techniques.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

FIG. 1 shows a view 100 illustrating a portion of an electronic device structure according to one embodiment. An insulating layer 107 is deposited on a substrate 101. In an embodiment, the substrate 101 comprises a semiconductor material, e.g., silicon (Si). In one embodiment, substrate 101 is a monocrystalline Si substrate. In another embodiment, substrate 101 is a polycrystalline silicon substrate. In yet another embodiment, substrate 101 is an amorphous silicon substrate. In alternative embodiments, substrate 101 includes silicon, germanium (Ge), silicon germanium (SiGe), a III-V materials based material e.g., gallium arsenide (GaAs), or any combination thereof. In one embodiment, the substrate 101 includes metallization interconnect layers for integrated circuits. In at least some embodiments, the substrate 101 includes a device layer comprising FEOL electronic devices 114, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In another embodiment, substrate 101 represents a previous interconnect layer. In at least some embodiments, the substrate 101 includes interconnects, for example, vias, configured to connect the metallization layers. In an embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon.

In various implementations, the substrate 101 includes an organic, a ceramic, a glass, or a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

In one embodiment, insulating layer 107 is an interlayer dielectric (ILD) layer. In one embodiment, insulating layer 107 is a low-k dielectric that includes, but is not limited to, materials such as, e.g., silicon dioxide, silicon oxide, carbon doped oxide (CDO), e.g., carbon doped silicon dioxide, silicon oxide nitride (SiON), silicon oxide carbide nitride (SiOCN), silicon oxide carbide (SiOC), silicon carbide (SiC), porous silicon dioxide, silicon nitride, or any combination thereof. In alternative embodiments, insulating layer 107 includes a nitride, oxide, a polymer, phosphosilicate glass, fluorosilicate (SiOF) glass, organosilicate glass (SiOCH), other electrically insulating layer determined by an electronic device design, or any combination thereof. In one embodiment, the thickness of insulating layer 107 is determined by design. In one embodiment, insulating layer 107 is deposited to the thickness from about 10 nanometers (nm) to about 2 microns (μm).

In one embodiment, insulating layer 107 is deposited using one of the deposition techniques, such as but not limited to a chemical vapor deposition (CVD), e.g., a plasma enhanced (PECVD), a physical vapour deposition (PVD), molecular beam epitaxy (MBE), metalorganic chemical vapor deposition (MOCVD), atomic layer deposition (ALD), spin-on, or other deposition techniques known to one of ordinary skill in the art of microelectronic device manufacturing.

As shown in FIG. 1, an interconnect layer 102 is deposited on a substrate 101. Interconnect layer 102 comprises a plurality of conductive features 105 formed on insulating layer 107. In one embodiment, interconnect layer 102 is a metallization layer. In one embodiment, conductive features 105 are e.g., conductive lines, conductive vias, and other conductive features. An interconnect layer 103 is deposited on the interconnect layer 102. An interconnect layer 103 comprises a plurality of conductive features 116 formed on insulating layer 107. In one embodiment, forming conductive features 116 involves forming a plurality of openings in the insulating layer 107 to expose conductive features 105 and depositing a conductive material into the openings. In at least some embodiments, the plurality of openings in the insulating layer 107 are formed using one or more patterning and etching techniques known to one of ordinary skill in the art of microelectronic device manufacturing.

In one embodiment, conductive features 116 are conductive vias. In alternative embodiments, conductive features 116 are e.g., conductive lines, conductive vias, or other conductive features. In one embodiment, interconnect layer 103 is a conductive via layer to interconnect an upper metallization layer with a lower metallization layer.

An interconnect layer 104 comprising conductive features 108, 109, 111 and 112 is formed on interconnect layer 103. In one embodiment, interconnect layer 104 is a metallization layer. In one embodiment, conductive features 116 are conductive lines. In alternative embodiments, conductive features 108, 109, 111 and 112 are e.g., conductive lines, conductive vias, or other conductive features. In one embodiment, interconnect layer 103 is a conductive via layer to connect interconnect layer 102 with interconnect layer 104.

In one embodiment, a distance between the conductive features (pitch) in a corresponding interconnect layer is determined by design. In one non-limiting example, the pitch between the conductive features is from about 10 nm to about 80 nm.

In one embodiment, forming conductive features 108, 109, 111 and 112 involves forming a plurality of openings in the insulating layer 107 to expose conductive features 116 and depositing a conductive layer 113 into the openings. In one embodiment, the openings in insulating layer 107 are formed using patterning and etching techniques known to one of ordinary skill in the art of microelectronic device manufacturing.

In one embodiment, a liner layer (not shown) is deposited onto a bottom and sidewalls 117 of the openings in the insulating layer 108 and conductive layer 113 is deposited on the liner layer. Generally, the liner layer is used to provide adhesion for the conductive layer to the insulating layer. In one embodiment, a barrier layer (not shown) is deposited on the liner layer underneath the conductive layer to prevent diffusion of the conductive material from the conductive layer into the insulating layer.

In one embodiment, the material of the conductive layer 113 comprises copper, nickel, cobalt, or any combination thereof. In one embodiment, the material of each of the conductive features 105, conductive features 116, and conductive layer 113 is a metal, e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum (Pt), other metal, or any combination thereof.

In alternative embodiments, examples of the conductive materials that may be used for the conductive lines and vias are, but not limited to, metals, e.g., copper, nickel, cobalt, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, the liner layer includes aluminum, titanium, titanium nitride, tantalum, tantalum nitride, tungsten, cobalt, ruthenium, the like metals, or any combination thereof. In one embodiment, the barrier layer deposited on the liner layer is one of the conductive materials described above with respect to liner layer. In one embodiment, the materials of the barrier layer and liner layers are different. In another embodiment, the materials of the barrier layer and liner layers are similar.

In one embodiment, the dimensions of each of the conductive features are determined by design. In one non-limiting example, the width of each of the conductive features is in an approximate range from about 5 nm to about 40 nm. In one non-limiting example, the height of each of the conductive features is in an approximate range from about 10 nm to about 500 nm. In one embodiment, the thickness of the liner layer deposited underneath the conductive layer 113 is in an approximate range from about 0.5 nm to about 5 nm.

In alternative embodiments, each of the conductive features 105, conductive features 116, and conductive layer 113 may be deposited using any of deposition techniques, such as but not limited to a CVD, PVD, MBE, MOCVD, ALD, electroless, electroplating or other deposition techniques known to one of ordinary skill in the art of microelectronic device manufacturing.

In alternative embodiments, each of the barrier layer and the liner layer may be deposited using any of deposition techniques, such as but not limited to a CVD, PVD, MBE, MOCVD, ALD, electroless, electroplating or other deposition techniques known to one of ordinary skill in the art of microelectronic device manufacturing.

In one embodiment, conductive layer 113, the barrier layer and the liner layer underneath the conductive layer 113 are removed from top portions of the insulating layer 107 using one of the chemical-mechanical polishing (CMP) techniques known to one of ordinary skill in the art of microelectronic device manufacturing.

FIG. 2 is a view 200 similar to FIG. 1 after the conductive layer 113 of the features 108, 109, 111 and 112 is recessed according to one embodiment. Conductive layer 113 is recessed to a depth 201 to expose a portion of the sidewall 117 of the insulating layer 107, as shown in FIG. 2. In one embodiment, the barrier layer and liner layer underneath the conductive layer 113 are recessed to depth 201. In one embodiment, depth 201 is determined by design. In one embodiment, depth 201 corresponds to about 20% to about 30% of the initial height 202 of the conductive feature 108.

The top portion of the recessed conductive layer 113 is lower than the top portion of the insulating layer 107, so that trenches, such as trenches 203, 204, 205 and 206 are created, as shown in FIG. 2. The trench 203 comprises opposing sidewalls that are the exposed portions of the insulating layer 107 and a bottom that is the top of the recessed conductive layer 113.

In one embodiment, the conductive layer 113 is recessed using one of etching techniques, e.g., a dry etching, a wet etching, or both etching techniques known to one of ordinary skill in the art of microelectronic device manufacturing. In one embodiment, the liner layer and the barrier layer underneath the conductive layer 113 are recessed using one of etching techniques, e.g., a dry etching, a wet etching, or both etching techniques known to one of ordinary skill in the art of microelectronic device manufacturing.

FIG. 3 is a view 300 similar to FIG. 2 after a protection layer 118 is deposited on a portion of the interconnect layer 104 and a monocrystalline semiconductor layer 301 is deposited on the conductive layer 113 according to one embodiment. Protection layer 118 is deposited to protect portions of the conductive layer 113 from being processed when a monocrystalline semiconductor layer is deposited on exposed portions of the conductive layer 113. In one embodiment, protection layer 118 comprises a hard mask layer. In one embodiment, protection layer 118 comprises a nitride layer, e.g., a silicon nitride, a silicon oxide nitride, silicon oxide, amorphous silicon, polysilicon, a carbon layer, e.g., amorphous carbon, silicon carbide, germanium, other hard mask layer, or any combination thereof. The protection layer 118 can be deposited using one of deposition techniques, such as but not limited to a CVD, PVD, MBE, MOCVD, ALD, spin-on, or other deposition techniques known to one of ordinary skill in the art of microelectronic device manufacturing.

A monocrystalline semiconductor layer 301 is formed on the recessed conductive layer 113. As shown in FIG. 3, the monocrystalline semiconductor layer 301 is vertically grown on the recessed conductive layer 113 within the trench 203. In one embodiment, the monocrystalline semiconductor layer 301 is selectively epitaxially grown on the recessed conductive layer 113 within the trench and is not grown on the insulating layer 107. In one embodiment, monocrystalline semiconductor layer 301 comprises a monocrystalline semiconductor layer grown on a nucleation layer comprising single crystalline semiconductor nanowires on the conductive layer 113. In an embodiment, an insulating layer 107 is an oxide layer (e.g., silicon oxide, or other oxide layer), and the nucleation layer is selectively grown only on the exposed portion of the conductive layer 113 that represents the bottom of the trench 203. The nucleation layer is not grown on the insulating oxide sidewalls of the trench 203.

In one embodiment, depositing monocrystalline semiconductor layer 301 involves growing a single crystalline alloy of the materials of the semiconductor layer 301 and conductive layer 113 (e.g., a nickel germanium, copper germanium, cobalt germanium, or other semiconductor conductive material alloy) that acts as a seed layer on the conductive layer 113 and then growing a single crystalline semiconductor layer on the single crystalline alloy. In one embodiment, the monocrystalline semiconductor layer 301 is grown to the thickness corresponds to the depth 201 of the trench 203.

In one embodiment, the monocrystalline semiconductor layer 301 comprises a group IV semiconductor material. Generally, the group IV material refers to a semiconductor material comprising one or more elements of the group IV of the periodic table, e.g., carbon (C), silicon (Si), germanium (Ge), tin (Sn), lead (Pb), or any combination thereof. In one embodiment, monocrystalline semiconductor layer 301 comprises a germanium layer, a silicon germanium (SiGe) layer, a silicon layer, or any combination thereof. In one embodiment, monocrystalline semiconductor layer 301 comprises Si, Ge, SiGe, carbon, other group IV semiconductor material, or any combination thereof. In one embodiment, monocrystalline semiconductor layer 301 is a Ge layer. In another embodiment, monocrystalline semiconductor layer 301 is a Si layer. In yet another embodiment, monocrystalline semiconductor layer 301 is SiGe layer. In one embodiment, monocrystalline semiconductor layer 301 is an n-type semiconductor. In another embodiment, monocrystalline semiconductor layer 301 is a p-type semiconductor. In yet another embodiment, the monocrystalline semiconductor layer 301 is an intrinsic semiconductor.

In one embodiment, the monocrystalline semiconductor layer 301 is a group IV semiconductor having n-type dopants, e.g., nitrogen (N), phosphorus (P), arsenic (As), antimony (Sb), bismuth (Bi), other n-type dopants, or any combination thereof. In another embodiment, the monocrystalline semiconductor layer 301 is a group IV semiconductor having p-type dopants, e.g., boron (B), aluminum (Al), gallium (Ga), indium (In), tallium (Tl), other p-type dopants, or any combination thereof. In one embodiment, the monocrystalline semiconductor layer 301 is an n-type Ge layer. In another embodiment, the monocrystalline semiconductor layer 301 is a p-type Ge layer. In yet another embodiment the monocrystalline semiconductor layer 301 is an intrinsic Ge layer. In alternative embodiments, monocrystalline semiconductor layer 301 is a III-V semiconductor, e.g., InP, GaAs, GaP, InGaAs, InAlAs, InAsSb, other monocrystalline semiconductor, or any combination thereof.

In one embodiment, the dopant concentration in the monocrystalline semiconductor layer 301 is at least about $10^{19}$ atoms/cm$^3$. In one embodiment, the concentration of the dopants in the monocrystalline semiconductor layer 301 is in an approximate range from about $10^{19}$ atoms/cm$^3$ to about $10^{21}$ atoms/cm$^3$. In one embodiment, the monocrystalline semiconductor layer 301 is doped to provide source/drain regions for a transistor.

In one embodiment, monocrystalline semiconductor layer 301 is deposited on conductive layer 113 using a selective chemical vapor deposition (CVD) process at a temperature less than 400 degrees C. In one embodiment, the crystalline nanowires are grown on the recessed portions of the conductive layer 113 within the trenches, such as trench 203.

In one embodiment, the monocrystalline layer 301 is deposited at a temperature less than 400 degrees C. In more specific embodiment, depositing a germanium monocrystalline layer 301 involves using germanium containing precursor gases at a temperature less than 400 degrees C. in a selective CVD process.

In alternative embodiments, the monocrystalline layer 301 is deposited using one of deposition techniques, such as but not limited to a CVD, PVD, MBE, MOCVD, ALD, or other deposition techniques known to one of ordinary skill in the art of microelectronic device manufacturing.

Figure 4:
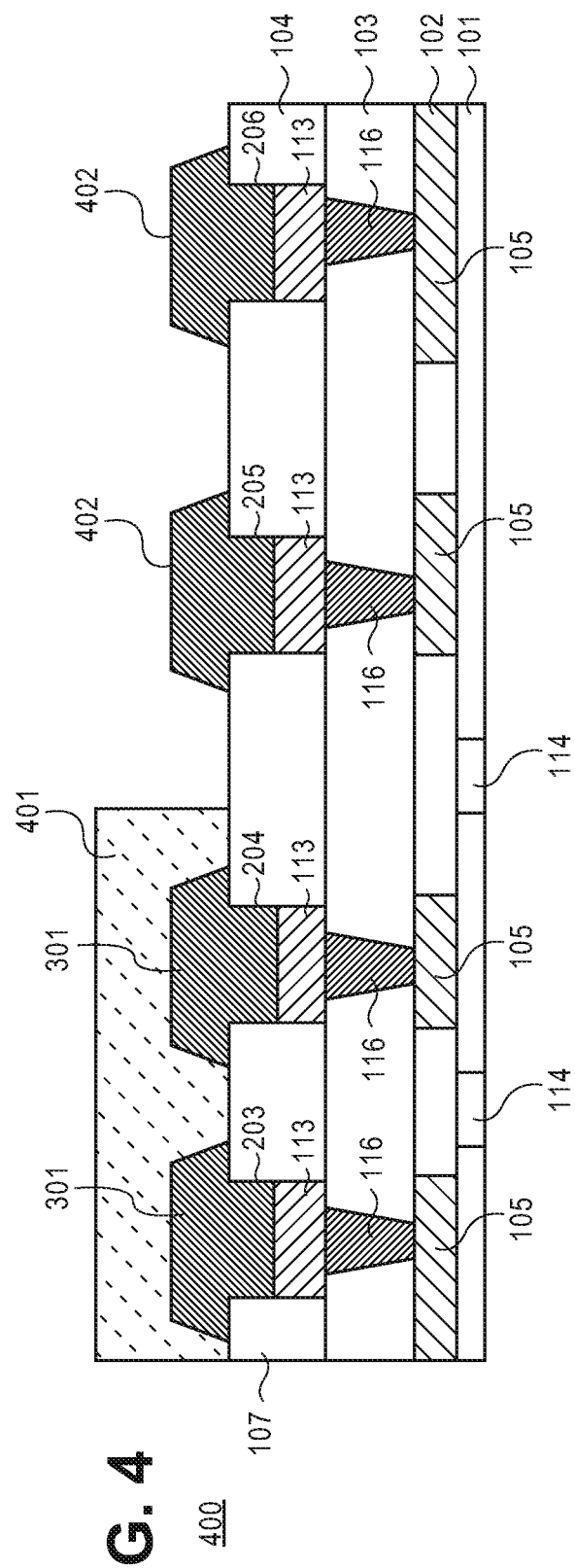
FIG. 4 is a view similar to FIG. 3 after a protection layer is deposited, and a monocrystalline semiconductor layer is deposited on the remaining exposed portions of the recessed conductive layer according to one embodiment.

FIG. 4 is a view 400 similar to FIG. 3 after a protection layer 401 is deposited on the monocrystalline layer 301, protection layer 118 is removed and a monocrystalline semiconductor layer 402 is deposited on the remaining exposed portions of the recessed conductive layer 113 according to one embodiment. In one embodiment, protection layer 401 is deposited to protect portions of the monocrystalline layer 301 from being processed when monocrystalline semiconductor layer 402 is deposited on the remaining exposed portions of the conductive layer 113. In one embodiment, protection layer 401 is one of the protection layer described above with respect to protection layer 118. In one embodiment, the protection layer 118 is removed using one of the protection layer removal techniques known to one of ordinary skill in the art of microelectronic device manufacturing.

The monocrystalline semiconductor layer 402 is formed on the recessed conductive layer 113. As shown in FIG. 4, the monocrystalline semiconductor layer 402 is vertically grown on the recessed conductive layer 113 within the trench. In one embodiment, the monocrystalline semiconductor layer 402 is selectively epitaxially grown on the recessed conductive layer 113 within the trench and is not grown on the insulating layer 107. In one embodiment, monocrystalline semiconductor layer 402 comprises single crystalline nanowires that are nucleated off the conductive layer 113. In one embodiment, a single crystalline alloy of the materials of the semiconductor layer 402 and conductive layer 113 is grown on the recessed conductive layer 113 and the monocrystalline semiconductor layer 402 is grown on the single crystal alloy. In one embodiment, the monocrystalline semiconductor layer 402 is as thick as the depth of the trench, as described above with respect to FIG. 3.

In one embodiment, the monocrystalline semiconductor layer 402 comprises a group IV semiconductor material. In one embodiment, monocrystalline semiconductor layer 402 comprises a germanium layer, a silicon germanium (SiGe) layer, a silicon layer, or any combination thereof. In one embodiment, monocrystalline semiconductor layer 402 comprises Si, Ge, SiGe, carbon, other group IV semiconductor material, or any combination thereof. In one embodiment, monocrystalline semiconductor layer 402 is a Ge layer. In another embodiment, monocrystalline semiconductor layer 402 is a Si layer. In yet another embodiment, monocrystalline semiconductor layer 402 is SiGe layer. In one embodiment, monocrystalline semiconductor layer 402 is an n-type semiconductor. In another embodiment, monocrystalline semiconductor layer 402 is a p-type semiconductor. In yet another embodiment, the monocrystalline semiconductor layer 402 is an intrinsic semiconductor.

In one embodiment, the monocrystalline semiconductor layer 402 is a group IV semiconductor having n-type dopants, e.g., nitrogen (N), phosphorus (P), arsenic (As), antimony (Sb), bismuth (Bi), other n-type dopants, or any combination thereof. In another embodiment, the monocrystalline semiconductor layer 402 is a group IV semiconductor having p-type dopants, e.g., boron (B), aluminum (Al), gallium (Ga), indium (In), tallium (Tl), other p-type dopants, or any combination thereof. In one embodiment, the monocrystalline semiconductor layer 402 is an n-type Ge layer. In another embodiment, the monocrystalline semiconductor layer 402 is a p-type Ge layer. In yet another embodiment the monocrystalline semiconductor layer 402 is an intrinsic Ge layer. In alternative embodiments, monocrystalline semiconductor layer 402 is a III-V semiconductor, e.g., InP, GaAs, GaP, InGaAs, InAlAs, InAsSb, other monocrystalline semiconductor, or any combination thereof.

In one embodiment, the dopant concentration in the monocrystalline semiconductor layer 402 is at least about $10^{19}$ atoms/cm$^3$. In one embodiment, the concentration of the dopants in the monocrystalline semiconductor layer 402 is in an approximate range from about $10^{19}$ atoms/cm$^3$ to about $10^{21}$ atoms/cm$^3$. In one embodiment, the monocrystalline semiconductor layer 402 is doped to provide source/drain regions for a transistor. In one embodiment, the monocrystalline semiconductor layer 301 is an n-type semiconductor and the monocrystalline semiconductor layer 402 is a p-type semiconductor. In another embodiment, the monocrystalline semiconductor layer 301 is a p-type semiconductor and the monocrystalline semiconductor layer 402 is an n-type semiconductor.

In one embodiment, monocrystalline semiconductor layer 402 is deposited on conductive layer 113 using a selective chemical vapor deposition (CVD) process at a temperature less than 400 degrees C. In one embodiment, the crystalline nanowires are grown on the recessed portions of the conductive layer 113 within the trenches, such as trench 203.

In one embodiment, the monocrystalline layer 402 is deposited at a temperature less than 400 degrees C. In more specific embodiment, depositing a germanium monocrystalline layer 402 involves using germanium containing precursor gases at a temperature less than 400 degrees C. in a selective CVD process. In alternative embodiments, the monocrystalline layer 402 is deposited using one of deposition techniques, such as but not limited to a CVD, PVD, MBE, MOCVD, ALD, or other deposition techniques known to one of ordinary skill in the art of microelectronic device manufacturing.

FIG. 5 is a view 500 similar to FIG. 4 after the protection layer 401 is removed and portions of the monocrystalline layers 301 and 402 are removed according to one embodiment. In one embodiment, the portions of the protection layer 401 and portions of the monocrystalline layers 301 and 402 that extend above the top of the insulating layer are removed using one of the CMP techniques known to one of ordinary skill in the art of microelectronic device manufacturing. In one embodiment, the monocrystalline layers 301 and 402 are polished for planarization to a predetermined thickness determined by design. In one embodiment, the thickness of the planarized monocrystalline layers 301 and 402 is in an approximate range from about 5 nm to about 50 nm.

FIG. 6 is a view 600 similar to FIG. 5 after a monocrystalline semiconductor layer 605 is deposited on the planarized monocrystalline layers 301 and 402 according to one embodiment. As shown in FIG. 6, a monocrystalline semiconductor layer 605 comprises portions 611, 612, 613 and 614 that are vertically grown on the planarized portions of the monocrystalline layers 301 and 402 along a Y axis. Monocrystalline semiconductor layer 605 comprises lateral portions 615, 616, 617 and 618 that extends laterally on insulating layer 107 along an X axis from portions 611, 612, 613 and 614 respectively. As shown in FIG. 5, lateral portion 615 merges seamlessly with lateral portion 616 and lateral portion 617 merges seamlessly with lateral portion 618 on insulating layer 107 so that a single crystalline layer 605 is formed. In one embodiment, the vertical portions 611, 612, 613 and 614 are grown using a selective CVD process having a set of epitaxial growth conditions (e.g., gas chemistry, temperature, pressure, or any combination thereof).

In one non-limiting example, the vertical portions of the monocrystalline semiconductor layer are grown using a selective CVD method that includes a germanium source, phosphorus and/or arsenic for an n-type doping, and boron and/or gallium for a p-type doping, at a pressure in an approximate range from about 1-2 millitorrs to about an atmospheric pressure and at a temperature in an approximate range from about 150 degrees C. to about 450 degrees C. The set of the epitaxial growth conditions of the selective CVD process (e.g., gas chemistry, temperature, pressure, or any combination thereof) is changed to grow the lateral portions 615, 616, 617 and 618. In one non-limiting example, the lateral portions of the monocrystalline semiconductor layer are grown using a selective CVD method with a germanium source without any dopants at a pressure in an approximate range from about few millitorrs to about an atmospheric pressure and at a temperature in an approximate range from about 150 degrees C. to about 450 degrees C. In one embodiment, the temperature to grow the lateral portions is greater than the temperature to grow the vertical portions. In one embodiment, the pressure to grow the lateral portions is different from the pressure to grow the vertical portions. In one embodiment, the pressure to grow the lateral portions is greater than the pressure to grow the vertical portions. In another embodiment, the pressure to grow the lateral portions is less than the pressure to grow the vertical portions. In one embodiment, the growth conditions are optimized for the best quality monocrystalline semiconductor layer.

In one embodiment, the monocrystalline semiconductor layer 605 comprises a group IV semiconductor material. In one embodiment, monocrystalline semiconductor layer 605 comprises a germanium layer, a silicon germanium (SiGe) layer, a silicon layer, or any combination thereof. In one embodiment, monocrystalline semiconductor layer 605 comprises Si, Ge, SiGe, carbon, other group IV semiconductor material, or any combination thereof. In one embodiment, monocrystalline semiconductor layer 605 is a Ge layer. In another embodiment, monocrystalline semiconductor layer 605 is a Si layer. In yet another embodiment, monocrystalline semiconductor layer 605 is SiGe layer. In one embodiment, monocrystalline semiconductor layer 605 is an intrinsic semiconductor. In another embodiment, monocrystalline semiconductor layer 605 is a p-type semiconductor, or an n-type semiconductor.

In one embodiment, the monocrystalline semiconductor layer 605 is a group IV semiconductor having n-type dopants, e.g., nitrogen (N), phosphorus (P), arsenic (As), antimony (Sb), bismuth (Bi), other n-type dopants, or any combination thereof. In another embodiment, the monocrystalline semiconductor layer 605 is a group IV semiconductor having p-type dopants, e.g., boron (B), aluminum (Al), gallium (Ga), indium (In), thallium (Tl), other p-type dopants, or any combination thereof. In yet another embodiment, the monocrystalline semiconductor layer 605 is an intrinsic semiconductor. In one embodiment, the monocrystalline semiconductor layer 605 is an n-type Ge layer. In another embodiment, the monocrystalline semiconductor layer 605 is a p-type Ge layer. In yet another embodiment the monocrystalline semiconductor layer 605 is an intrinsic Ge layer. In alternative embodiments, monocrystalline semiconductor layer 605 is a III-V semiconductor, e.g., InP, GaAs, GaP, InGaAs, InAlAs, InAsSb, other monocrystalline semiconductor, or any combination thereof.

In one embodiment, the dopant concentration in the monocrystalline semiconductor layer 605 is substantially less than that of the monocrystalline semiconductor layers 301 and 402. In at least some embodiments, the dopant concentration in the monocrystalline semiconductor layer 605 is not greater than about $5\times10^{17}$ atoms/cm$^3$. In one embodiment, the monocrystalline semiconductor layer 605 is an undoped (intrinsic) semiconductor to provide a channel region for a transistor. In one embodiment, the thickness of the monocrystalline semiconductor layer 605 is in an approximate range from about 5 nm to about 50 nm.

In one embodiment, the monocrystalline semiconductor layer 605 is deposited using a selective CVD process. In at least some embodiments, the monocrystalline semiconductor layer 605 is deposited using one of the deposition techniques, such as but not limited to a CVD, PVD, MBE, MOCVD, ALD, or other deposition techniques known to one of ordinary skill in the art of microelectronic device manufacturing. In one embodiment, the thickness of the monocrystalline semiconductor layer 605 is adjusted using one of the CMP techniques known to one of ordinary skill in the art of microelectronic device manufacturing.

Figure 16:
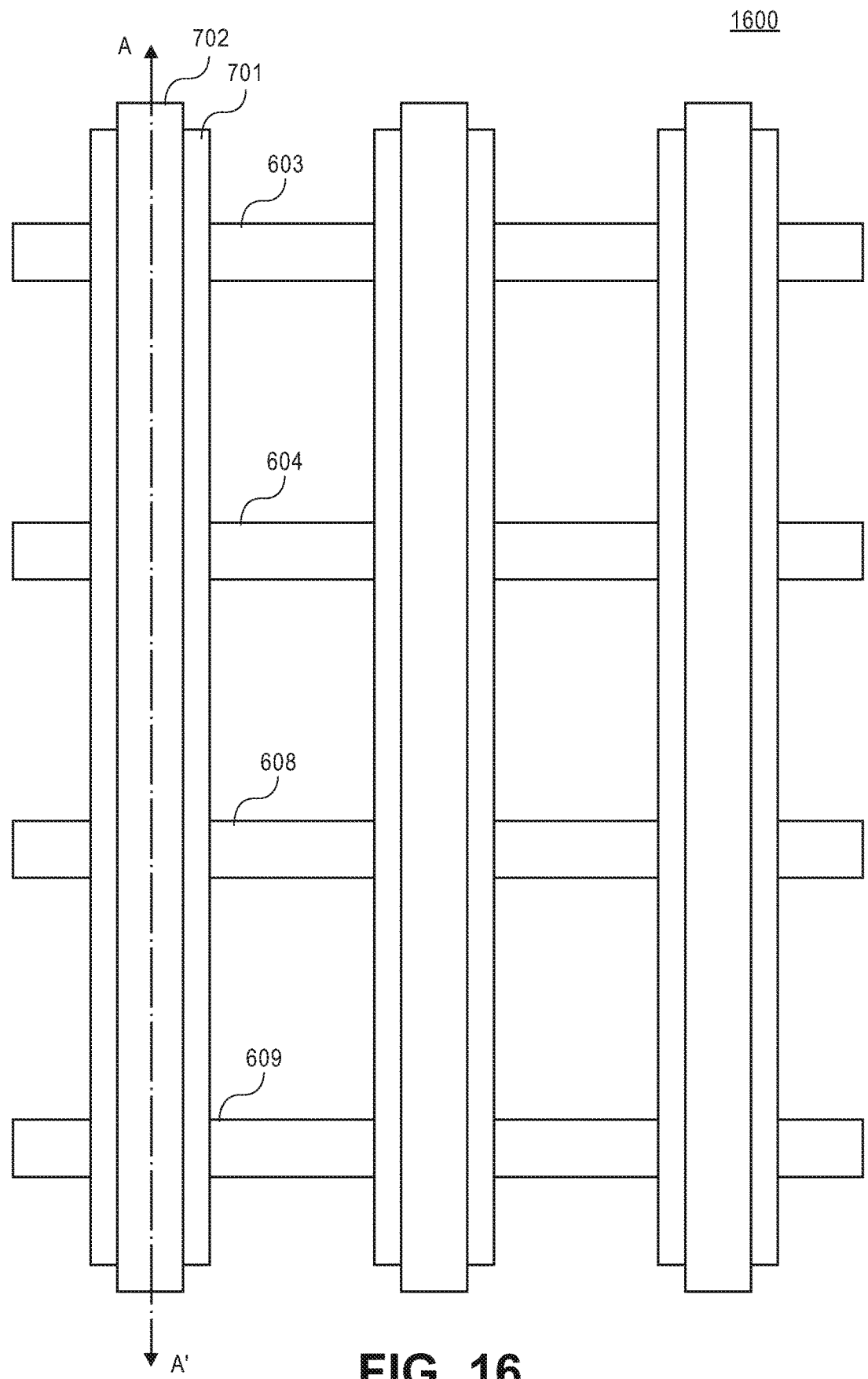
FIG. 16 is a top view illustrating an electronic device structure to provide single crystalline transistors according to one embodiment.

FIG. 7 is a view 700 that is similar to FIG. 6 after a gate electrode layer 702 is deposited on a gate dielectric layer 701 on monocrystalline semiconductor layer 605 according to one embodiment. FIG. 16 is a top view 1600 illustrating an electronic device structure to provide single crystalline transistors according to one embodiment. FIG. 7 is a cross-sectional view of FIG. 16 along an A-A' axis. As shown in FIGS. 7 and 16, a gate dielectric layer 701 is deposited on monocrystalline semiconductor layer 605. A gate electrode layer 702 is deposited on gate dielectric layer 701. In one embodiment, gate dielectric layer 701 is a high-k dielectric material having a dielectric constant greater than the dielectric constant of silicon dioxide. In one embodiment, gate dielectric layer 701 comprises a high-k dielectric material, such as a metal oxide dielectric. For example, gate dielectric layer 701 can be but not limited to tantalum silicon oxide (TaSiOx); pentaoxide (Ta2 O5), and titanium oxide (TiO2) zirconium oxide (ZrO2), hafnium oxide (HfO2), lanthanum oxide (La2O4), lead zirconium titanate (PZT), other high-k dielectric material, or a combination thereof. In an embodiment, the gate dielectric layer 701 is a silicon dioxide (SiO2), silicon oxynitride (SiOx Ny) or a silicon nitride (Si3 N4) dielectric layer. In an embodiment, the thickness of the gate dielectric layer 701 is in an approximate range from about 1 nm to about 20 nm, and more specifically, from about 5 nm to about 10 nm.

Gate electrode layer 702 can be formed of any suitable gate electrode material. In an embodiment, the gate electrode 702 is a metal gate electrode, such as but not limited to, tungsten, tantalum, titanium, and their nitrides. It is to be appreciated, the gate electrode 702 need not necessarily be a single material and can be a composite stack of thin films, such as but not limited to a polycrystalline silicon/metal electrode or a metal/polycrystalline silicon electrode.

In at least some embodiments, the gate dielectric layer 701 is deposited using one of gate dielectric layer deposition techniques, such as but not limited to a chemical vapour deposition (CVD), a physical vapour deposition (PVD), molecular beam epitaxy (MBE), metalorganic chemical vapor deposition (MOCVD), atomic layer deposition (ALD), spin-on, or other deposition techniques known to one of ordinary skill in the art of microelectronic device manufacturing. In at least some embodiments, the gate electrode layer 702 is deposited using one of gate electrode deposition techniques known to one of ordinary skill in the art of microelectronic device manufacturing.

As shown in FIGS. 7 and 16, the portions of the planarized monocrystalline layer 301 represent a source region 603 and a drain region 604 for a transistor. The portions of the planarized monocrystalline layer 402 represent a source region 608 and a drain region 609 for a transistor. In one embodiment, the source and drain regions 603 and 604 have the same conductivity type such as n-type or p-type conductivity. In one embodiment, the source and drain regions 608 and 609 have the same conductivity type (n-type or p-type conductivity) that is different from the conductivity type of the source and drain regions 603 and 604. In one non-limiting example, to form a CMOS transistor structure, source and drain regions 603 and 604 are p-type semiconductor regions and source and drain regions 608 and 609 are n-type semiconductor regions, or vice versa. In one embodiment, the recessed portions of the conductive layer 113 represent source and drain contacts 601, 602, 606 and 607 to respective source and drain regions 603, 604, 608 and 609. In an embodiment, the source and drain regions have a doping concentration between $1\times10^{19}$ and $1\times10^{21}$ atoms/cm$^3$. The source and drain regions can be formed of uniform concentration or can include sub-regions of different concentrations or doping profiles such as tip regions (e.g., source and drain extensions). In an embodiment, the source and drain regions have the same doping concentration and profile. In an embodiment, the doping concentration and profile of the source and drain regions can vary in to obtain a particular electrical characteristic.

A portion 703 of the monocrystalline semiconductor layer 605 located between the source region 603 and drain region 604 defines a channel region of the transistor. The channel region can also be defined as the area of the monocrystalline semiconductor layer 605 underneath the gate electrode. At times however, the source and drain regions may extend slightly beneath the gate electrode through, for example, diffusion to define a channel region slightly smaller than the gate electrode length (Lg). In an embodiment, the channel region is intrinsic or undoped. In an embodiment, the channel region is doped, for example to a conductivity level in an approximate range between $1\times10^{16}$ to $1\times10^{19}$ atoms/cm$^3$. In an embodiment, when the channel region is doped it is typically doped to the opposite conductivity type of the source and drain regions. For example, when the source and drain regions are n-type conductivity the channel region would be doped to a p type conductivity. Similarly, when the source and drain regions are P type conductivity the channel region would be n-type conductivity. In this manner a transistor can be formed into either a NMOS transistor or a PMOS transistor respectively. Channel regions can be uniformly doped or can be doped non-uniformly or with differing concentrations to provide particular electrical and performance characteristics. For example channel regions can include halo regions, if desired.

FIG. 8 is a view 800 similar to FIG. 7 after depositing a patterned mask layer 801 on gate electrode layer 702 according to one embodiment. A patterned hard mask layer 801 comprises a patterned feature 802 and a patterned feature 803 that a separated by a space 804 to expose a portion of the gate electrode layer 702, as shown in FIG. 8. As shown in FIG. 8, the patterned feature 802 has a width 805 and the patterned feature 803 has a width 806. In one embodiment, the width of the patterned feature defines a position of the monocrystalline channel portion of the transistor above the source/drain regions, as described in further detail below with respect to FIG. 10.

In one embodiment, hard mask layer 801 is etched through a patterned photoresist layer deposited thereon to form space 804 to separate transistor devices. In at least some embodiments, the photoresist layer is patterned using one of the photoresist deposition and patterning techniques known to one of ordinary skill in the art of electronic device manufacturing.

In one embodiment, hard mask layer 801 is a carbon hard mask layer. In alternative embodiments, hard mask layer 801 is a nitride layer, e.g., a silicon nitride, a silicon oxide nitride, silicon oxide, amorphous silicon, polysilicon, a carbon layer, e.g., amorphous carbon, silicon carbide, germanium, TiN, other hard mask layer, or any combination thereof. The hard mask layer 801 can be deposited and patterned using one of the hard mask layer deposition and patterning techniques known to one of ordinary skill in the art of electronic device manufacturing.

FIG. 9 is a view 900 similar to FIG. 8 after portions of the gate electrode layer 702 on gate dielectric layer 701 on monocrystalline semiconductor layer 605 on the insulating layer 107 are etched to form a space 901 to separate a transistor device 902 from a transistor device 903 according to one embodiment. In one embodiment, the portions of the gate electrode layer 702 on gate dielectric layer 701 on monocrystalline semiconductor layer 605 on the insulating layer 107 are etched through opening 804 in the patterned mask layer 801 using one or more of the dry etching, wet etching, or a combination thereof techniques known to one of ordinary skill in the art of microelectronic device manufacturing. The gate electrode layer 702 is etched to form a gate electrode 908 and a gate electrode 909, the gate dielectric layer 701 is etched to form a gate dielectric 906 and a gate dielectric 907, and the monocrystalline semiconductor layer 605 is etched to form a portion 904 and a portion 905 to form transistor devices 902 and 903.

Figure 17:
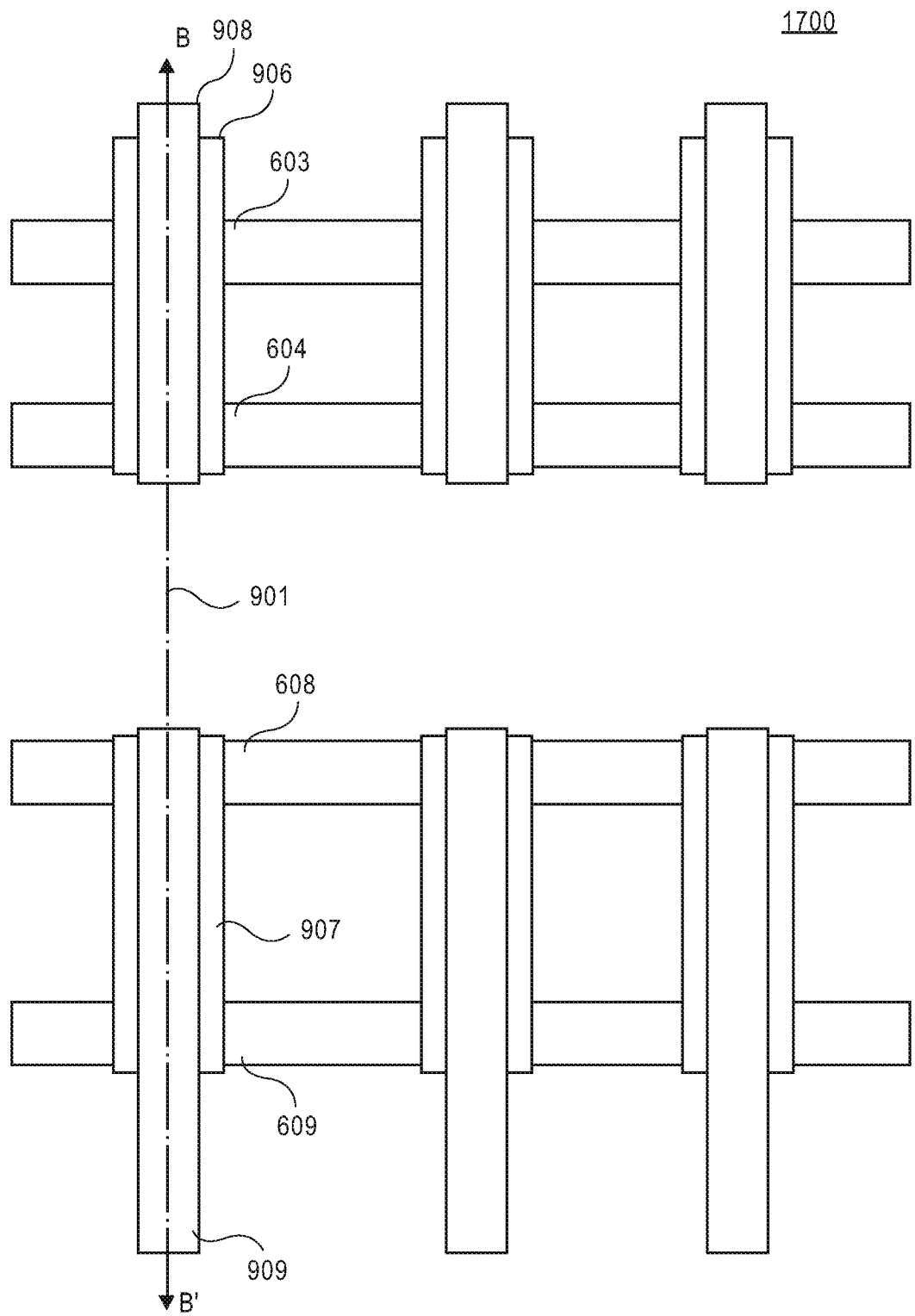
FIG. 17 is a top view illustrating an electronic device structure to provide single crystalline transistors according to one embodiment.

FIG. 10 is a view 1000 similar to FIG. 9 after the patterned mask layer is removed according to one embodiment. FIG. 17 is a top view 1700 illustrating an electronic device structure to provide single crystalline transistors according to one embodiment. FIG. 10 is a cross-sectional view of FIG. 17 along an axis B-B'. In at least some embodiments, the patterned hard mask layer is removed using one of the chemical-mechanical polishing (CMP) techniques, or other patterned mask layer removal techniques known to one of ordinary skill in the art of microelectronic device manufacturing.

As shown in FIGS. 10 and 17, an electronic device structure comprises transistor device 902 and transistor device 903 that are separated by space 901. In at least some embodiments, the electronic device structure comprising transistor devices 902 and 903 is a part of a BEOL structure. In one embodiment, transistor device 902 is an NMOS device and transistor device 903 is a PMOS device. In another embodiment, transistor device 902 is a PMOS device and transistor device 903 is an NMOS device. Transistor device 902 comprises gate electrode 908 on gate dielectric 906 on monocrystalline semiconductor portion 904. One end of the monocrystalline semiconductor portion 904 is deposited on source region 603 and an opposite end of the monocrystalline semiconductor portion 904 is deposited on drain region 604. As shown in FIG. 10, portion 904 comprises a channel portion 703 between the source and drain regions 603 and 604.

As shown in FIGS. 10 and 17, transistor device 903 comprises gate electrode 909 on gate dielectric 907 on monocrystalline semiconductor portion 905. One end of the monocrystalline semiconductor portion 905 is deposited on source region 608 and an opposite end of the monocrystalline semiconductor portion 905 is deposited on drain region 609. As shown in FIG. 10, portion 905 comprises a channel portion 704 between the source and drain regions 608 and 609.

In one embodiment, a position of the channel portion on each of the source/drain regions depends on the design. In one embodiment, the channel portion is on and along the entire width of each of the source/drain regions to increase a source/drain contact area with the channel region and reduce the contact resistance. As shown in FIG. 10, the entire width of each of the source/drain regions 603 and 604 is underneath monocrystalline semiconductor portion 904.

In another embodiment, the channel portion is on a part of the width of each of the source/drain regions to reduce an unwanted capacitance that may be created when a gate electrode deposited above the channel portion overlaps with the source/drain regions. As shown in FIG. 10, only a part of the width of each of the source/drain regions 608 and 609 is underneath monocrystalline semiconductor portion 904. In one embodiment, the source/drain contact area of the channel region 703 is greater than the source/drain contact area of the channel region 704.

In one embodiment, each of the monocrystalline semiconductor portions 904 and 905 comprises a fin. In one embodiment, each of the monocrystalline semiconductor portions 904 and 905 comprises a nanowire. In one embodiment, each of the transistors 901 and 902 is a non-planar transistor (e.g., a tri-gate, a gate all around (GAA), a fin based field effect transistor (FinFET), nanowire, or any other non-planar transistor). The source and drain regions 603, 604, 608 and 609 are connected through respective source and drain contacts 601, 602, 606 and 607 and conductive features 116 to the conductive features of the interconnect layer 102, as shown in FIG. 10.

FIG. 11 is a view 1100 similar to FIG. 10 after an insulating layer 1101 is deposited to fill space 901 between transistor devices 902 and 903 according to one embodiment. In at least some embodiments, insulating layer 1101 represents one of the insulating layers described above with respect to insulating layer 107. As shown in FIG. 11, insulating layer 1101 is deposited on and between the transistor devices 902 and 903. In one embodiment, insulating layer 1101 is polished for planarization using one of the CMP techniques known to one of ordinary skill in the art of microelectronic device manufacturing.

FIG. 12 is a view 1200 similar to FIG. 11 after openings are formed in the insulating layer 1101 to provide a contact to a gate electrode according to one embodiment. As shown in FIG. 12, insulating layer 1101 is etched to form openings to expose top portions of the gate electrodes 908 and 909. As shown in FIG. 12, the opening to expose a portion of the gate electrode 908 comprises a trench portion 1204 and a via portion 1203. The opening to expose a portion of the gate electrode 909 comprises a trench portion 1201 and a via portion 1202, as shown in FIG. 12. In one embodiment, the openings in insulating layer 1101 are formed using patterning and etching techniques known to one of ordinary skill in the art of microelectronic device manufacturing.

Figure 13:
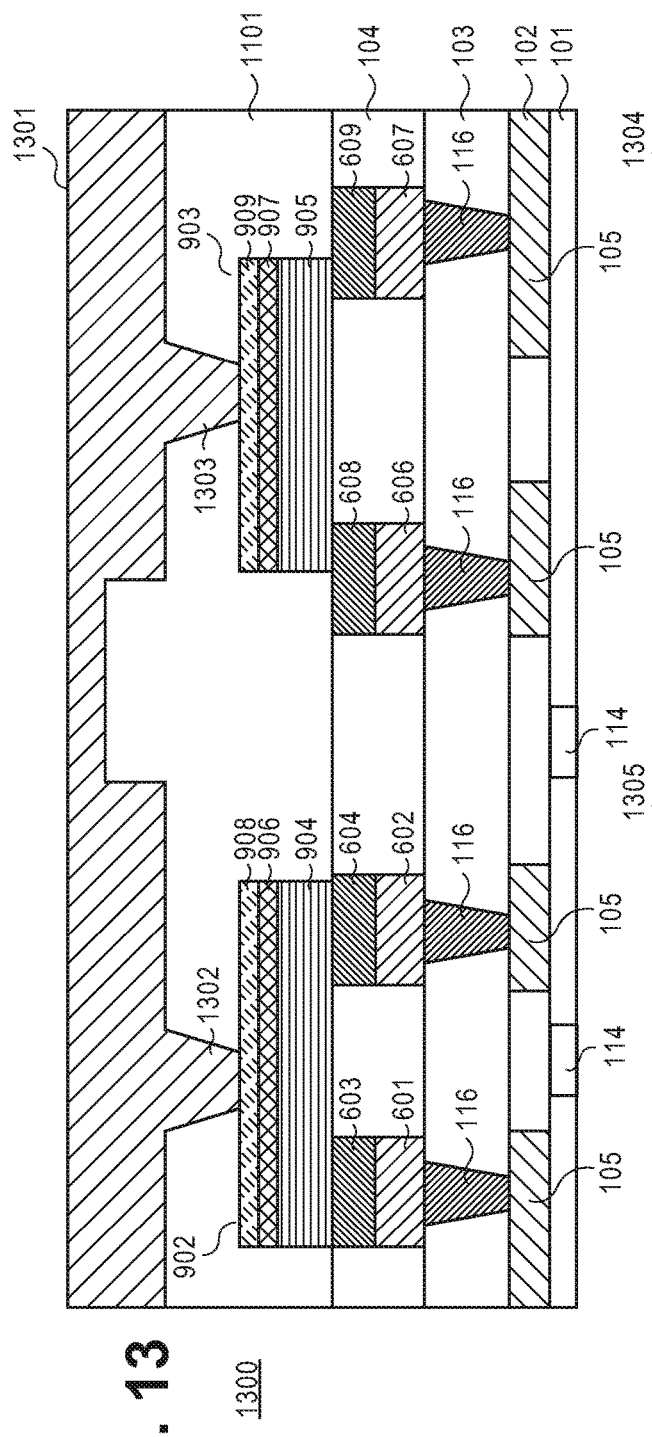
FIG. 13 is a view 1300 similar to FIG. 12 after gate contacts are formed to gate electrodes 908 and 909 according to one embodiment.

FIG. 13 is a view 1300 similar to FIG. 12 after gate contacts are formed to gate electrodes 908 and 909 according to one embodiment. As shown in FIG. 13, a conductive layer 1301 is deposited into the openings in the insulating layer 1101 and onto the exposed portions of the gate electrodes 908 and 909. The conductive layer 1301 is deposited into via portion 1203 to form a gate contact 1302. The conductive layer 1301 is deposited into via portion 1202 to form a gate contact 1303. In one embodiment, the conductive layer 1301 is deposited into trench portions 1201 and 1204 to form metal lines of an interconnect layer above the transistor devices 902 and 903.

In one embodiment, a liner layer (not shown) is deposited onto a bottom and sidewalls of the openings in the insulating layer 1101 and conductive layer 1301 is deposited on the liner layer. In one embodiment, a barrier layer (not shown) is deposited on the liner layer underneath the conductive layer to prevent diffusion of the conductive material from the conductive layer into the insulating layer. In one embodiment, conductive layer 1301 represents one of the conductive layers described above.

Figure 14:
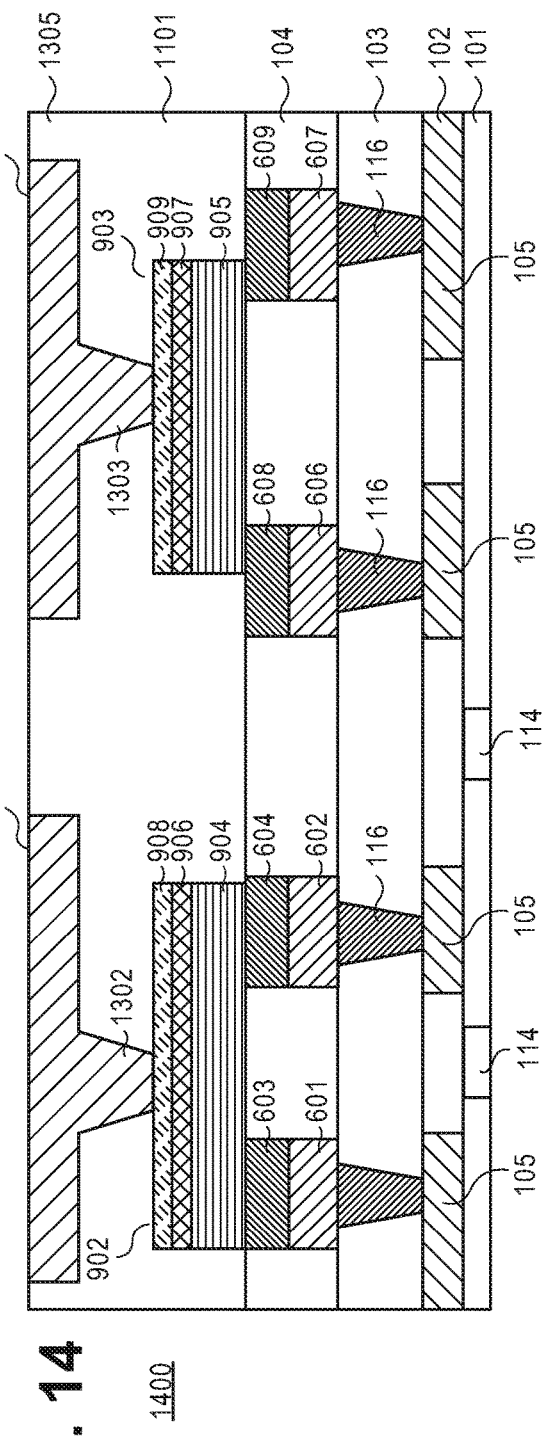
FIG. 14 is a view 1400 similar to FIG. 13 after the conductive layer 1301 is planarized according to one embodiment.

FIG. 14 is a view 1400 similar to FIG. 13 after the conductive layer 1301 is planarized according to one embodiment. In one embodiment, the conductive layer 1301 is planarized using one of the CMP techniques known to one of ordinary skill in the art of microelectronic device manufacturing. As shown in FIG. 14, an interconnect layer 1305 is formed above transistors 902 and 903. Interconnect layer 1305 comprises a metal line 1305 and a metal line 1304 formed of conductive layer 1301. Gate contact 1302 connects gate 908 to metal line 1305. Gate contact 1303 connects gate 909 to metal line 1304.

Figure 15:
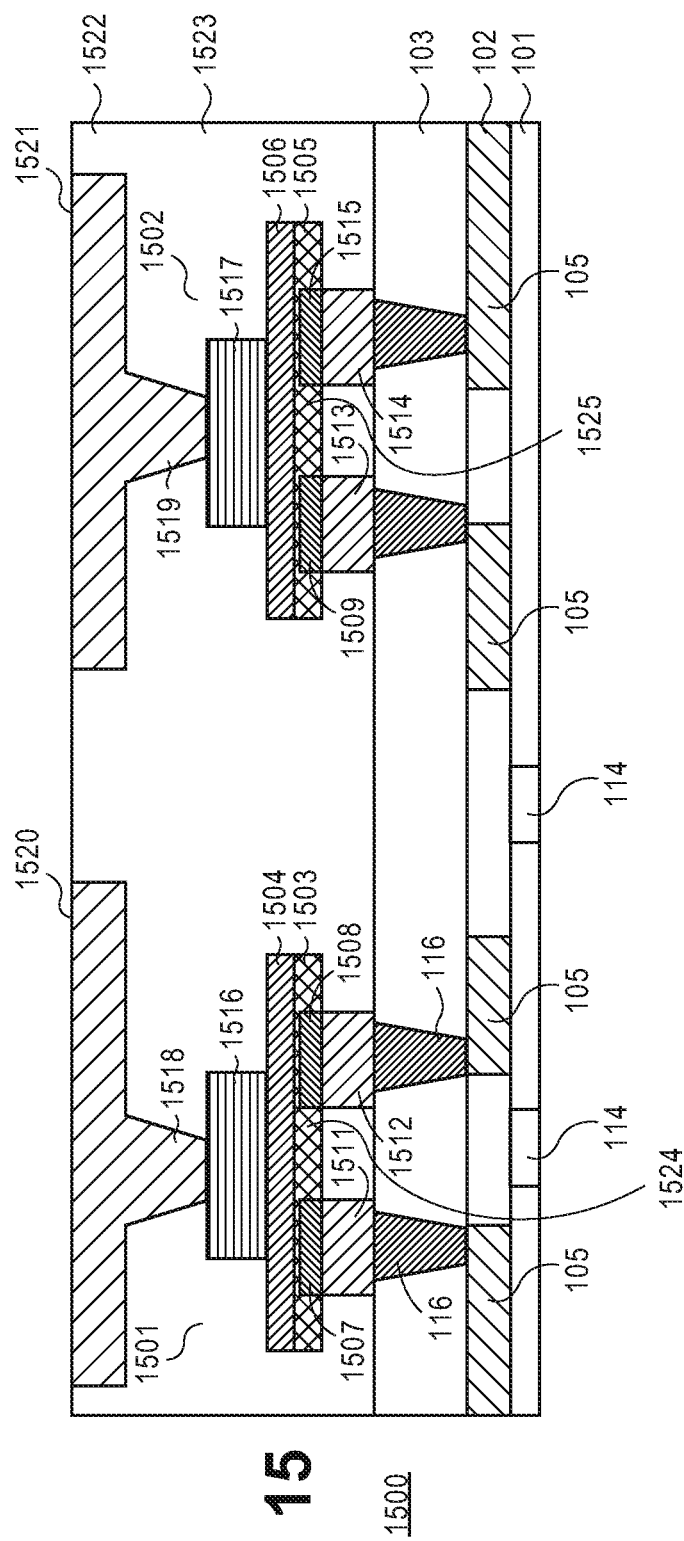
FIG. 15 is a view similar to FIG. 14 illustrating a portion of an electronic device structure according to another embodiment.

FIG. 15 is a view 1500 similar to FIG. 14 illustrating a portion of an electronic device structure according to another embodiment. The electronic device structure comprises a transistor device 1501 and a transistor device 1502 formed on an insulating layer 1523 that are separated by a space, as described above. In at least some embodiments, transistor devices 902 and 903 are a part of a BEOL structure, as described above. Transistor device 1501 comprises a gate electrode 1516 on a gate dielectric 1504 on a monocrystalline semiconductor portion 1503. Transistor device 1502 comprises a gate electrode 1517 on a gate dielectric 1506 on a monocrystalline semiconductor portion 1505. An interconnect layer 1522 is formed above transistors 1501 and 1502. Interconnect layer 1522 comprises a metal line 1520 and a metal line 1521. A gate contact 1518 connects gate electrode 1516 to metal line 1520. A gate contact 1519 connects gate electrode 1517 to metal line 1521.

As shown in FIG. 15, monocrystalline semiconductor portion 1503 comprises a source region 1507, a channel portion 1524 and a drain region 1508. The channel portion 1524 is between the source region 1507 and drain region 1508. The monocrystalline semiconductor portion 1505 comprises a source region 1509, a channel portion 1524 and a drain region 1515. The channel portion 1524 is between the source region 1509 and drain region 1515.

As shown in FIG. 15, the source region 1507 is deposited on a conductive feature 1511 and drain region 1508 is deposited on a conductive feature 1508 to connect via respective conductive features 116 to the conductive features 105 of the interconnect layer 102. The source region 1509 is deposited on a conductive feature 1513 and drain region 1515 is deposited on a conductive feature 1515 to connect via respective conductive features 116 to the conductive features 105 of the interconnect layer 102. In one embodiment, conductive features 1507, 1508, 1509 and 1515 act as respective drain/source contacts, as described above.

FIG. 15 is different from FIG. 14 in that the source/drain regions 1507, 1508, 1509 and 1515 are deposited on the conductive features that have not been recessed in the trenches. As shown in FIG. 15, an interface 1526 of the conductive feature 1511 with the source region 1507 is at the same level as an interface 1527 of the insulating layer 1523 with the channel portion 1524. In one embodiment, the source and drain regions 1507 and 1508 represent portions of the monocrystalline semiconductor layer 301. In one embodiment, the source and drain regions 1509 and 1515 represent portions of the monocrystalline semiconductor layer 402. In one embodiment, the channel portions 1524 and 1525 represent portions of monocrystalline semiconductor layer 605.

In at least some embodiments, the insulating layer 1523 represents one of the insulating layers described above. In at least some embodiments, each of the gate electrodes 1516 and 1517 represents one of the gate electrodes described above. In at least some embodiments, each of the gate dielectrics 1504 and 1505 represents one of the gate dielectrics described above. In at least some embodiments, each of the metal lines 1520 and 1521 represents one of the metal lines described above. In at least some embodiments, each of the gate contacts 1518 and 1519 represents one of the gate contacts described above.

Figure 18:
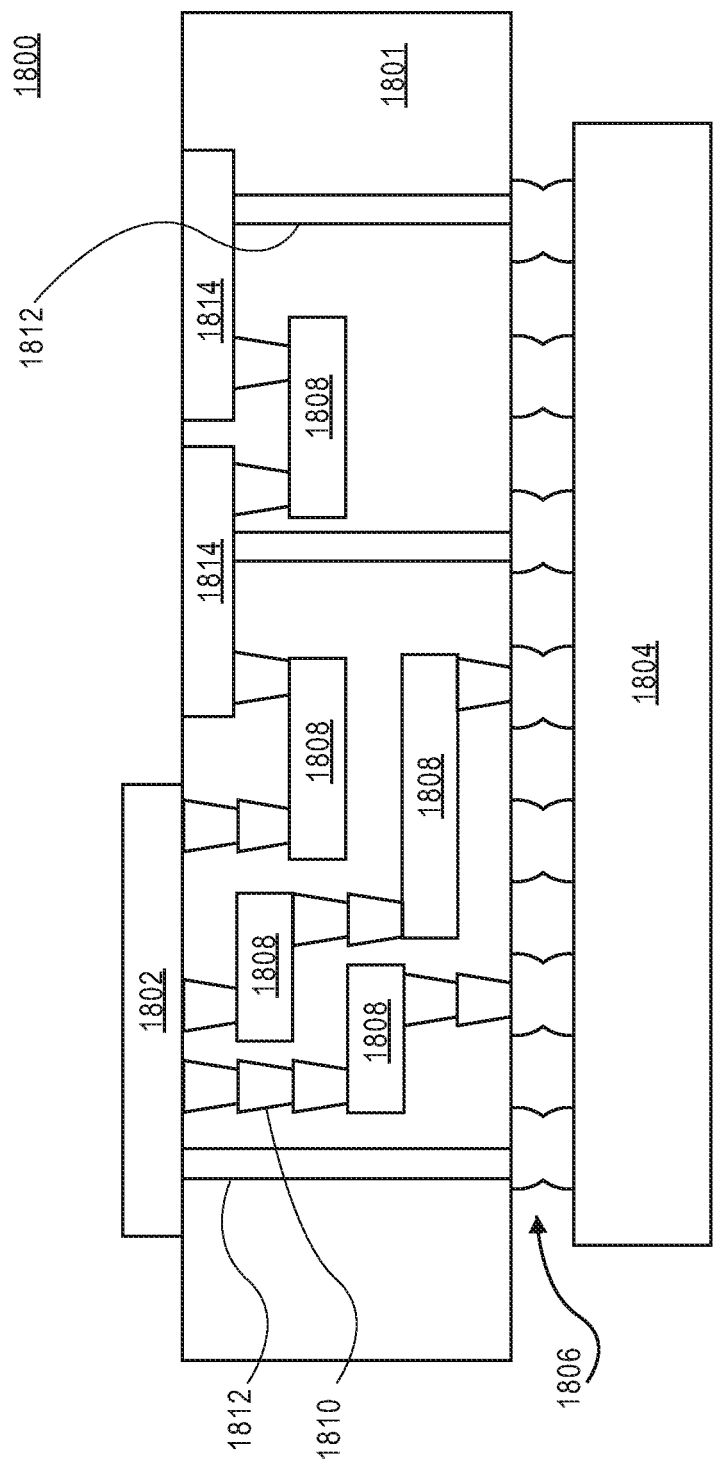
FIG. 18 illustrates an interposer that includes one or more embodiments of the invention.

FIG. 18 illustrates an interposer 1800 that includes one or more embodiments of the invention. The interposer 1800 is an intervening substrate used to bridge a first substrate 1802 to a second substrate 1804. The first substrate 1802 may be, for instance, an integrated circuit die. The second substrate 1804 may be, for instance, a memory module, a computer motherboard, or another integrated circuit die. Generally, the purpose of an interposer 1800 is to spread a connection to a wider pitch or to reroute a connection to a different connection. For example, an interposer 1800 may couple an integrated circuit die to a ball grid array (BGA) 1806 that can subsequently be coupled to the second substrate 1804. In some embodiments, the first and second substrates 1802/1804 are attached to opposing sides of the interposer 1800. In other embodiments, the first and second substrates 1802/1804 are attached to the same side of the interposer 1800. And in further embodiments, three or more substrates are interconnected by way of the interposer 1800.

The interposer 1800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1808, vias 1810 and through-silicon vias (TSVs) 1812. The interposer 1800 may further include embedded devices 1814, including passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, MEMS devices and transistors including single crystalline transistors integrated in a BEOL structure as described above may also be formed on the interposer 1800. In accordance with embodiments of the invention, apparatuses or processes disclosed herein may be used in the fabrication of interposer 1800.

Figure 19:
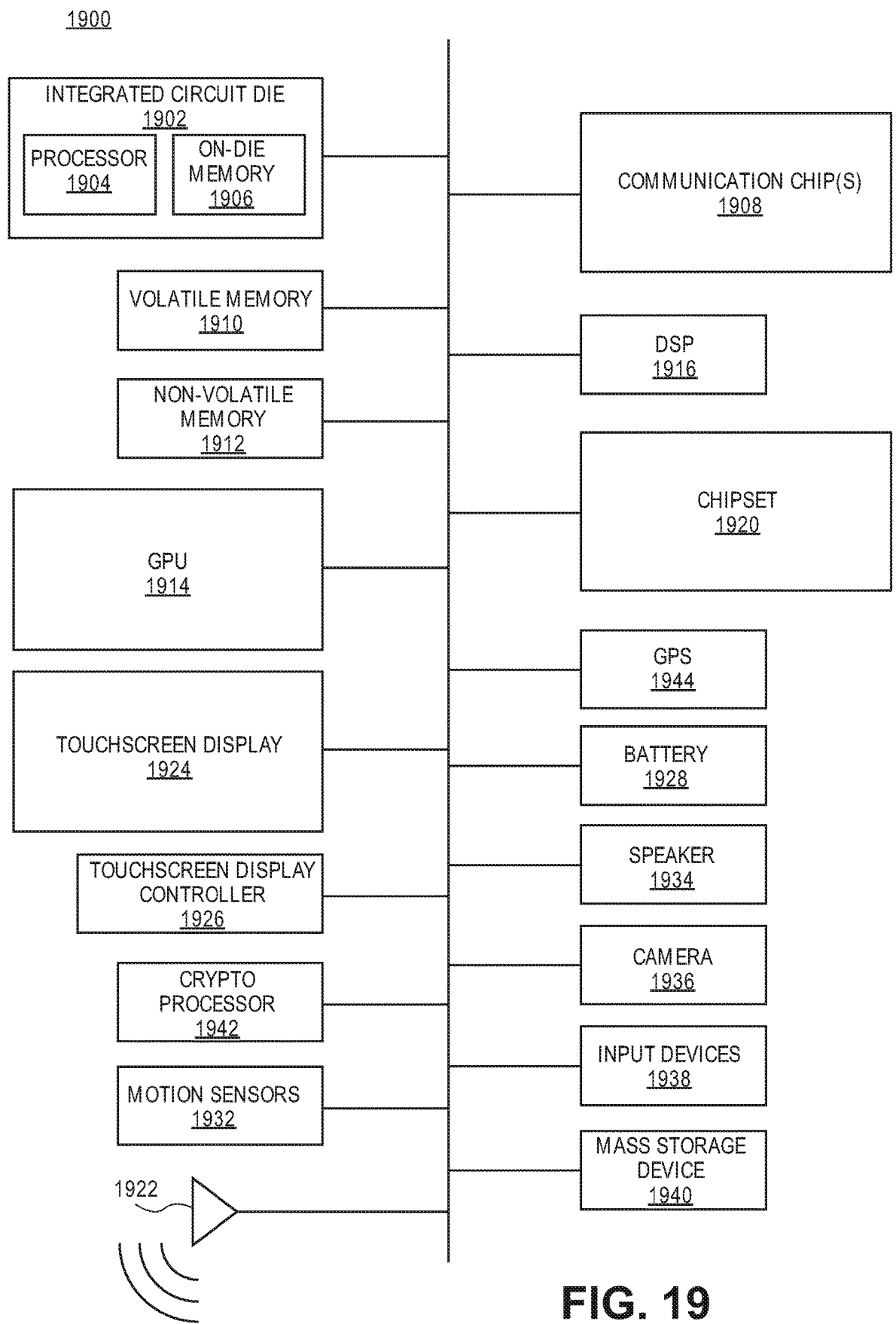
FIG. 19 illustrates a computing device in accordance with one embodiment of the invention.

FIG. 19 illustrates a computing device 1900 in accordance with one embodiment of the invention. The computing device 1900 may include a number of components. In one embodiment, these components are attached to one or more motherboards. In an alternate embodiment, these components are fabricated onto a single system-on-a-chip (SoC) die rather than a motherboard. The components in the computing device 1900 include, but are not limited to, an integrated circuit die 1801 and at least one communication chip 1908. In some implementations the communication chip 1908 is fabricated as part of the integrated circuit die 1801. The integrated circuit die 1801 may include a processor 1904 such as a central processing unit (CPU), an on-die memory 1906, often used as cache memory, that can be provided by technologies such as embedded DRAM (eDRAM) or spin-transfer torque memory (STTM or STTM-RAM).

Computing device 1900 may include other components that may or may not be physically and electrically coupled to the motherboard or fabricated within an SoC die. These other components include, but are not limited to, a volatile memory 1910 (e.g., DRAM), a non-volatile memory 1912 (e.g., ROM or flash memory), a graphics processing unit 1914 (GPU), a digital signal processor 1916 (DSP), a crypto processor 1942 (a specialized processor that executes cryptographic algorithms within hardware), a chipset 1920, an antenna 1922, a display or a touchscreen display 1924, a touchscreen display controller 1926, a battery 1928 or other power source, a global positioning system (GPS) device 1944, a power amplifier (PA), a compass, a motion coprocessor or sensors 1932 (that may include an accelerometer, a gyroscope, and a compass), a speaker 1934, a camera 1936, user input devices 1938 (such as a keyboard, mouse, stylus, and touchpad), and a mass storage device 1940 (such as hard disk drive, compact disk (CD), digital versatile disk (DVD), and so forth).

The communication chip 1908 enables wireless communications for the transfer of data to and from the computing device 1900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1900 may include a plurality of communication chips 1908. For instance, a first communication chip 1908 may be dedicated to shorter range wireless communications such as Wi-Fi and Bluetooth and a second communication chip 1908 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. One or more components (e.g., integrated circuit die 1801, communication chip 1908, GPU 1914, cryptoprocessor 1942, DSP 1916, chipset 1920), and other components may include single crystalline transistors integrated in a BEOL structure in accordance with embodiments of the invention. In further embodiments, another component housed within the computing device 1900 may contain one or more single crystalline transistors formed in accordance with embodiments of the invention.

In various embodiments, the computing device 1900 may be a laptop computer, a netbook computer, a notebook computer, an ultrabook computer, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1900 may be any other electronic device that processes data.

The above description of illustrative implementations of the invention, including what is described in the Abstract, is not intended to be exhaustive or to limit the invention to the precise forms disclosed. While specific implementations of, and examples for the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments:

1. In Example 1, an electronic device comprises a monocrystalline semiconductor layer on a conductive layer on an insulating layer on a substrate; the conductive layer being a part of an interconnect layer, the monocrystalline semiconductor layer comprising a back end of line transistor channel portion extending laterally on the insulating layer, wherein the monocrystalline semiconductor layer comprises a group IV semiconductor material.
2. In Example 2, the subject matter of Example 1 can optionally include that the monocrystalline semiconductor layer comprises a back end of line transistor source/drain portion on the conductive layer.
3. In Example 3, the subject matter of any of Examples 1-2 can optionally include that the conductive layer comprises copper, nickel, cobalt, or any combination thereof.
4. In Example 4, the subject matter of any of Examples 1-3 can optionally include that the monocrystalline semiconductor layer comprises a fin.
5. In Example 5, the subject matter of any of Examples 1-4 can optionally include a front end of line transistor underneath the monocrystalline semiconductor layer.
6. In Example 6, the subject matter of any of Examples 1-5 can optionally include that the conductive layer is deposited on a liner layer on the insulating layer.
7. In Example 7, the subject matter of any of Examples 1-6 can optionally include a gate dielectric layer on the monocrystalline semiconductor layer; and a gate electrode on the gate dielectric layer.
8. In Example 8, an electronic device comprises a conductive layer on a first insulating layer on a substrate; a first monocrystalline semiconductor layer on the conductive layer; and
9. a second monocrystalline semiconductor layer on the first monocrystalline semiconductor layer, the second monocrystalline semiconductor layer comprising a back end of line transistor channel portion extending laterally on the first insulating layer, wherein at least one of the first monocrystalline semiconductor layer and the second monocrystalline semiconductor layer comprises a group IV material.
10. In Example 9, the subject matter of Example 8 can optionally include that the conductive layer is a part of a first interconnect layer.
11. In Example 10, the subject matter of any of Examples 8-9 can optionally include that the first monocrystalline semiconductor layer comprises a back end of line transistor source/drain portion on the conductive layer.
12. In Example 11, the subject matter of any of Examples 8-10 can optionally include that the first monocrystalline semiconductor layer comprises at least one of an n-type doped semiconductor or a p-type doped semiconductor.
13. In Example 12, the subject matter of any of Examples 8-11 can optionally include that the second monocrystalline semiconductor layer comprises an intrinsic semiconductor.
14. In Example 13, the subject matter of any of Examples 8-12 can optionally include a front end of line transistor underneath the at least one of the first monocrystalline semiconductor layer and the second monocrystalline semiconductor layer.
15. In Example 14, the subject matter of any of Examples 8-13 can optionally include that the conductive layer comprises copper, nickel, cobalt, or any combination thereof.
16. In Example 15, the subject matter of any of Examples 8-14 can optionally include a third monocrystalline semiconductor layer on a first portion of the conductive layer, wherein the first monocrystalline semiconductor layer is deposited on a second portion of the conductive layer.
17. In Example 16, the subject matter of any of Examples 8-15 can optionally include that at least one of the first monocrystalline semiconductor layer and the second monocrystalline semiconductor layer comprises a fin.
18. In Example 17, the subject matter of any of Examples 8-16 can optionally include a gate dielectric layer on the second monocrystalline semiconductor layer; a gate electrode layer on the gate dielectric layer; a gate contact on the gate electrode; and a second interconnect layer on the gate contact.
19. In Example 18, the subject matter of any of Examples 8-17 can optionally include a second insulating layer on at least a portion of the second monocrystalline semiconductor layer.
20. In Example 19, a method to manufacture an electronic device comprises forming a monocrystalline semiconductor layer on a conductive layer on an insulating layer on a substrate; the conductive layer being a part of an interconnect layer, the monocrystalline semiconductor layer comprising a back end of line transistor channel portion extending laterally on the insulating layer, wherein the monocrystalline semiconductor layer comprises a group IV semiconductor material.
21. In Example 20, the subject matter of Example 19 can optionally include that the monocrystalline semiconductor layer comprises a back end of line transistor source/drain portion on the conductive layer.
22. In Example 21, the subject matter of any of Examples 19-20 can optionally include forming an opening in an insulating layer on the insulating layer; depositing a conductive layer into the opening.
23. In Example 22, the subject matter of any of Examples 19-21 can optionally include that the conductive layer comprises copper, nickel, cobalt, or any combination thereof.
24. In Example 23, the subject matter of any of Examples 19-22 can optionally include recessing the conductive layer.
25. In Example 24, the subject matter of any of Examples 19-23 can optionally include that the conductive layer is deposited on a liner layer.
26. In Example 25, the subject matter of any of Examples 19-24 can optionally include depositing a gate dielectric layer on the monocrystalline semiconductor layer; and depositing a gate electrode on the gate dielectric layer.
27. In Example 26, the subject matter of any of Examples 19-25 can optionally include depositing a protection layer on a portion of the interconnect layer.
28. In Example 27, a method to manufacture a transistor device comprises depositing a first monocrystalline semiconductor layer on the conductive layer, wherein the conductive layer is deposited on a first insulating layer on a substrate; depositing a second monocrystalline semiconductor layer on the first monocrystalline semiconductor layer, wherein the second monocrystalline semiconductor layer comprises a back end of line transistor channel portion that extends laterally on the first insulating layer and wherein at least one of the first monocrystalline semiconductor layer and the second monocrystalline semiconductor layer comprises a group IV material.

29. In Example 28, the subject matter of Example 27 can optionally include the conductive layer is a part of a first interconnect layer.

30. In Example 29, the subject matter of any of Examples 27-28 can optionally include that the first monocrystalline semiconductor layer comprises a back end of line transistor source/drain portion on the conductive layer.

31. In Example 30, the subject matter of any of Examples 27-29 can optionally include that the first monocrystalline semiconductor layer comprises at least one of an n-type doped semiconductor or a p-type doped semiconductor.

32. In Example 31, the subject matter of any of Examples 27-30 can optionally include that the second monocrystalline semiconductor layer comprises an intrinsic semiconductor.

33. In Example 32, the subject matter of any of Examples 27-31 can optionally include that the conductive layer comprises copper, nickel, cobalt, or any combination thereof.

34. In Example 33, the subject matter of any of Examples 27-32 can optionally include recessing the conductive layer.

35. In Example 34, the subject matter of any of Examples 27-33 can optionally include depositing a first protection layer on a first portion of the conductive layer, wherein the first monocrystalline semiconductor layer is deposited on a second portion of the conductive layer.

36. In Example 35, the subject matter of any of Examples 27-34 can optionally include depositing a second protection layer on the first monocrystalline semiconductor layer; and depositing a third monocrystalline semiconductor layer on the first portion of the conductive layer.

37. In Example 36, the subject matter of any of Examples 27-35 can optionally include that the conductive layer is deposited on a liner layer on the insulating layer.

38. In Example 37, the subject matter of any of Examples 27-36 can optionally include depositing a gate dielectric layer on the second monocrystalline semiconductor layer; depositing a gate electrode layer on the gate dielectric layer; forming a gate contact to the gate electrode; and forming a second interconnect layer on the gate contact.

39. In Example 38, the subject matter of any of Examples 27-37 can optionally include etching the second monocrystalline semiconductor layer to form a space; and depositing a second insulating layer to fill the space.

40. In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. A method to manufacture an electronic device comprising:
    forming a monocrystalline semiconductor layer on a conductive layer, the conductive layer recessed in an insulating layer on a substrate; the conductive layer being a part of an interconnect layer, the monocrystalline semiconductor layer on the recessed conductive layer and extending laterally over and on the insulating layer.

2. The method of claim 1, wherein the monocrystalline semiconductor layer comprises a group IV semiconductor material.

3. The method of claim 1, wherein the monocrystalline semiconductor layer comprises a source/drain portion on the conductive layer and a channel portion on the insulating layer.

4. The method of claim 1, wherein the conductive layer comprises copper, nickel, cobalt, or any combination thereof.

5. The method of claim 1, further comprising recessing the conductive layer.

6. The method of claim 1, further comprising
    depositing a gate dielectric layer on the monocrystalline semiconductor layer; and
    depositing a gate electrode on the gate dielectric layer.

7. The method of claim 1, further comprising
    depositing a protection layer on a portion of the interconnect layer.

8. A method to manufacture a transistor device comprising:
    depositing a first monocrystalline semiconductor layer on a conductive layer, wherein the conductive layer is deposited on a first insulating layer on a substrate, wherein the conductive layer is a part of a first interconnect layer; and
    depositing a second monocrystalline semiconductor layer directly on the first monocrystalline semiconductor layer, wherein the second monocrystalline semiconductor layer extends laterally on the first insulating layer.

9. The method of claim 8, wherein the first monocrystalline semiconductor layer comprises at least one of an n-type doped semiconductor or a p-type doped semiconductor.

10. The method of claim 8, wherein the second monocrystalline semiconductor layer comprises an intrinsic semiconductor.

11. The method of claim 8, wherein at least one of the first monocrystalline semiconductor layer and the second monocrystalline semiconductor layer comprises a group IV material.

12. The method of claim 8, further comprising recessing the conductive layer.

13. The method of claim 8, further comprising
    depositing a first protection layer on a first portion of the conductive layer, wherein the first monocrystalline semiconductor layer is deposited on a second portion of the conductive layer;
    depositing a second protection layer on the first monocrystalline semiconductor layer; and
    depositing a third monocrystalline semiconductor layer on the first portion of the conductive layer.

14. The method of claim 8, further comprising
    depositing a gate dielectric layer on the second monocrystalline semiconductor layer;
    depositing a gate electrode layer on the gate dielectric layer;
    forming a gate contact to the gate electrode; and
    forming a second interconnect layer on the gate contact.

15. An electronic device comprising:
    a monocrystalline semiconductor layer on a conductive layer, the conductive layer recessed in an insulating layer on a substrate; the conductive layer being a part of an interconnect layer, the monocrystalline semiconductor layer on the recessed conductive layer and extending laterally over and on the insulating layer.

16. The electronic device of claim 15, wherein the monocrystalline semiconductor layer comprises a group IV semiconductor material.

17. The electronic device of claim 15, wherein the monocrystalline semiconductor layer comprises a source/drain portion on the conductive layer and a channel portion on the insulating layer.

18. The electronic device of claim 15, wherein the conductive layer comprises copper, nickel, cobalt, or any combination thereof.

19. The electronic device of claim 15, wherein the monocrystalline semiconductor layer comprises a fin.

20. The electronic device of claim 15, further comprising
a gate dielectric layer on the monocrystalline semiconductor layer; and
a gate electrode on the gate dielectric layer.

21. A method to manufacture a transistor device comprising:
depositing a first monocrystalline semiconductor layer on a conductive layer, wherein the conductive layer is deposited on a first insulating layer on a substrate, wherein the conductive layer is a part of a first interconnect layer; and
depositing a second monocrystalline semiconductor layer on the first monocrystalline semiconductor layer, wherein the second monocrystalline semiconductor layer extends laterally on the first insulating layer, wherein the second monocrystalline semiconductor layer comprises an intrinsic semiconductor.

22. A method to manufacture a transistor device comprising:
depositing a first protection layer on a first portion of a conductive layer, wherein the conductive layer is deposited on a first insulating layer on a substrate, wherein the conductive layer is a part of a first interconnect layer;
depositing a first monocrystalline semiconductor layer on the conductive layer, wherein the first monocrystalline semiconductor layer is deposited on a second portion of the conductive layer;
depositing a second monocrystalline semiconductor layer on the first monocrystalline semiconductor layer, wherein the second monocrystalline semiconductor layer extends laterally on the first insulating layer;
depositing a second protection layer on the first monocrystalline semiconductor layer; and
depositing a third monocrystalline semiconductor layer on the first portion of the conductive layer.

* * * * *